(12) United States Patent
Lee

(10) Patent No.: US 12,075,571 B2
(45) Date of Patent: Aug. 27, 2024

(54) ELECTRONIC DEVICE INCLUDING SUPPORT MEMBER

(71) Applicant: SAMSUNG ELECTRONICS CO., LTD., Suwon-si (KR)

(72) Inventor: Ohhee Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 176 days.

(21) Appl. No.: 17/662,192

(22) Filed: May 5, 2022

(65) Prior Publication Data

US 2023/0011003 A1 Jan. 12, 2023

Related U.S. Application Data

(63) Continuation of application No. PCT/KR2022/004911, filed on Apr. 6, 2022.

(30) Foreign Application Priority Data

Jul. 8, 2021 (KR) .......... 10-2021-0089928
Jan. 17, 2022 (KR) .......... 10-2022-0006733

(51) Int. Cl.
*H05K 5/00* (2006.01)

(52) U.S. Cl.
CPC ................. *H05K 5/0017* (2013.01)

(58) Field of Classification Search
CPC .......... H05K 5/0217; H05K 5/0017
USPC ........ 361/807, 728, 752, 796, 800, 809, 810
See application file for complete search history.

(56) References Cited

U.S. PATENT DOCUMENTS

| | | |
|---|---|---|
| 2011/0297578 A1 | 12/2011 | Stiehl et al. |
| 2016/0050302 A1 | 2/2016 | Lee et al. |
| 2017/0302766 A1 | 10/2017 | Lee et al. |
| 2021/0037126 A1* | 2/2021 | Yoo .............. H04M 1/0202 |
| 2021/0204435 A1* | 7/2021 | Choi .............. G06F 1/1656 |
| 2021/0347098 A1* | 11/2021 | Kim .............. B29C 45/14647 |

FOREIGN PATENT DOCUMENTS

| | | |
|---|---|---|
| JP | H06-091701 A | 4/1994 |
| JP | 2000355032 A | 12/2000 |
| KR | 10-1991-0000302 A | 1/1991 |
| KR | 101077153 B1 | 10/2011 |
| KR | 10-2016-0019833 A | 2/2016 |

(Continued)

OTHER PUBLICATIONS

International Search Report dated Jul. 13, 2022 in connection with International Patent Application No. PCT/KR2022/004911, 2 pages.

(Continued)

*Primary Examiner* — Hung S. Bui

(57) ABSTRACT

According to various embodiments of the disclosure, an electronic device may include a support member formed of a first material and including a first surface, a second surface opposite to the first surface, and an accommodation space formed between the first surface and the second surface, and an indicator formed of a second material different from the first material, at least partially disposed inside the accommodation space, and including a third surface visually exposed to an outside of the support member and forming substantially a same surface with at least a part of the first surface of the support member.

19 Claims, 28 Drawing Sheets

(56) References Cited

FOREIGN PATENT DOCUMENTS

| KR | 10-2016-0147090 A | 12/2016 |
| KR | 10-2017-0112044 A | 10/2017 |
| KR | 10-2018-0109734 A | 10/2018 |
| KR | 10-2020-0040077 A | 4/2020 |
| KR | 10-2020-0047045 A | 5/2020 |
| KR | 10-2020-0087587 A | 7/2020 |

OTHER PUBLICATIONS

Written Opinion of the International Searching Authority dated Jul. 13, 2022 in connection with International Patent Application No. PCT/KR2022/004911, 3 pages.

* cited by examiner

ELECTRONIC DEVICE INCLUDING SUPPORT MEMBER

CROSS-REFERENCE TO RELATED APPLICATIONS

This application is a continuation of International Application No. PCT/KR2022/004911, filed Apr. 6, 2022, which claims priority to Korean Patent Application No. 10-2021-0089928, filed Jul. 8, 2021, and Korean Patent Application No. 10-2022-0006733, filed Jan. 17, 2022, the disclosures of which are incorporated by reference herein in their entireties.

BACKGROUND

1. Field

Various embodiments of the disclosure relate to an electronic device including a support member.

2. Description of Related Art

Owing to the development of information and communication technology and semiconductor technology, the distribution and use of various electronic devices are rapidly increasing. Particularly, recent electronic devices are being developed such that communication may be conducted while the electronic devices are carried.

In addition, the electronic devices may output stored information as sound or an image. As the integration level of the electronic devices increases and high-speed and large-capacity wireless communication becomes common, one electronic device such as a mobile communication terminal may be equipped with various functions in recent years. For example, an entertainment function such as games, a multimedia function such as music/video playback, communication and security functions for mobile banking, schedule management, and an electronic wallet function as well as a communication function are integrated into a single electronic device. Such electronic devices are being miniaturized so that users may conveniently carry them.

An electronic device having a communication function, such as a portable terminal, is being reduced in size and weight to maximize portability and convenience, and integrated components are arranged in a smaller space in the electronic device to achieve high performance.

SUMMARY

A support member for accommodating various components of the electronic device may include a curved surface formed by cutting. The support member may include a processed structure (e.g., a groove) formed at a position adjacent to the curved area of the support member to determine how much the support member has been cut. A degree to which the support member is processed and the length of the support member may be measured by using the processed structure. However, since it is difficult to position the processed structure on the curved surface, the accuracy of determining the processed dimensions of the support member may be decreased. When the curved shape of the support member is poor, coupling between a component and the support member may become weaker, and the durability of the electronic device may be reduced.

According to various embodiments of the disclosure, an electronic device for displaying a degree to which a support member has been cut on a curved surface of a support member may be provided.

The objects to be achieved in the disclosure may extend to various objects without departing from the scope and spirit of the disclosure, not limited to the above-described objects.

According to various embodiments of the disclosure, an electronic device may include a support member formed of a first material and including a first surface, a second surface opposite to the first surface, and an accommodation space formed between the first surface and the second surface, and an indicator formed of a second material different from the first material, at least partially disposed inside the accommodation space, and including a third surface visually exposed to an outside of the support member and forming substantially a same surface with at least a part of the first surface of the support member.

According to various embodiments of the disclosure, an electronic device may include a support member formed of a first material and including an accommodation space, and an indicator formed of a second material different from the first material and at least partially disposed inside the accommodation space. The indicator may include a first area at least partially visually exposed to an outside of the support member, and a second area extending from the first area and covered by the support member.

An electronic device according to various embodiments of the disclosure may include an indicator visually exposable to the outside of a support member based on a degree to which the support member is processed. Based on the degree to which the indicator is visually exposed to the outside of the support member, it may be identified whether the support member is defective, and the dimensions of the support member may be managed by using the indicator. Accordingly, assembly failure of components assembled to the support member may be prevented or reduced.

Before undertaking the detailed description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
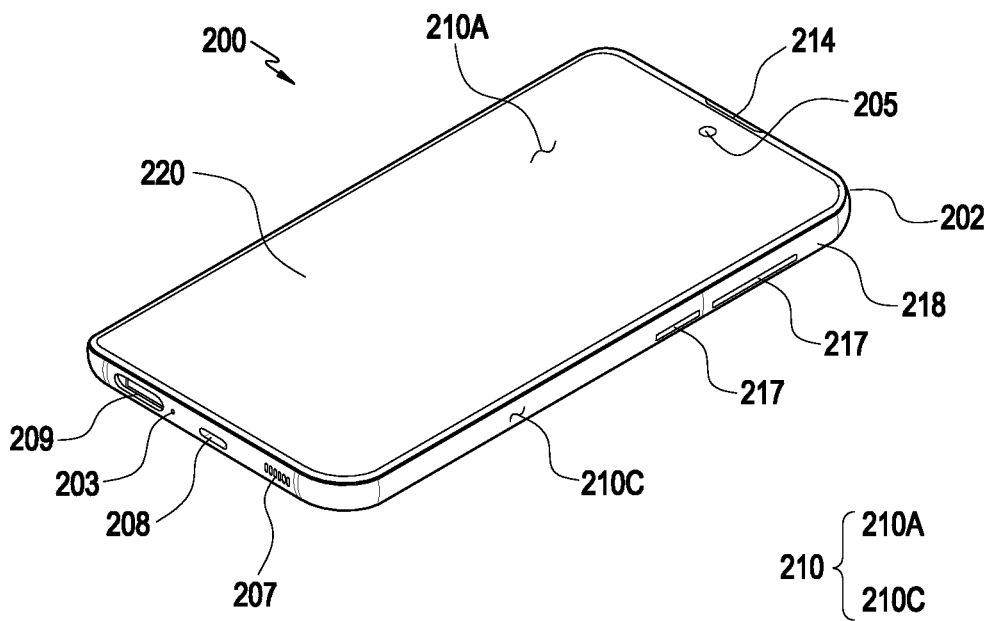
FIG. 1 is a front perspective view illustrating an electronic device according to various embodiments of the disclosure.

FIGS. 1 through 26A, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

An electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
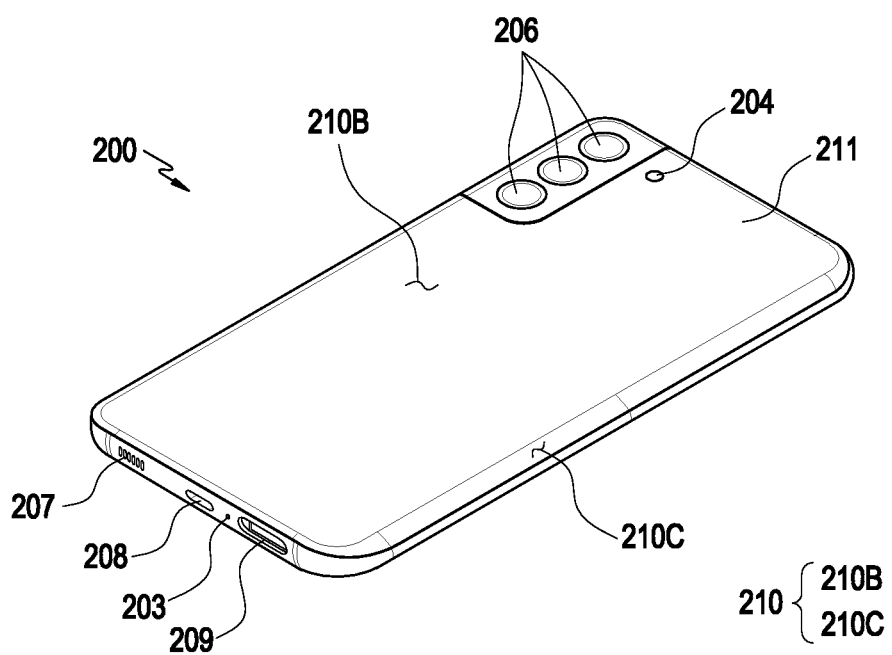
FIG. 2 is a rear perspective view illustrating an electronic device according to various embodiments of the disclosure.

FIG. 1 is a front perspective view illustrating an electronic device according to various embodiments of the disclosure. FIG. 2 is a rear perspective view illustrating the electronic device according to various embodiments of the disclosure.

Referring to FIGS. 1 and 2, an electronic device 200 according to an embodiment may include a housing 210 which includes a front surface 210A, a rear surface 210B, and a side surface 210C surrounding a space between the front surface 210A and the rear surface 210B. In certain embodiments, the housing 210 may refer to a structure that forms a part of the front surface 210A of FIG. 1, the rear surface 210B of FIG. 2, and the side surface 210C. For example, the housing 210 may include a front plate 202 and a rear plate 211. According to an embodiment, at least a part of the front surface 210A may be formed by the front plate 202 (e.g., a glass plate or polymer plate including various coating layers) that is at least partially substantially transparent. The rear surface 210B may be formed by the rear plate 211. The rear plate 211 may be formed of, for example, glass, ceramic, polymer, metal (e.g., titanium (Ti), stainless steel (STS), aluminum (Al), and/or magnesium (Mg)), or a combination of at least two of these materials. The side surface 210C may be coupled with the front plate 202 and the rear plate 211 and formed by a side bezel structure (or "side member") 218 including metal and/or polymer. In some embodiments, the rear plate 211 and the side bezel structure 218 may be integrally formed and include the same material (e.g., glass, a metallic material such as aluminum, or ceramic). In another embodiment, the front surface 210A and/or the front plate 202 may be interpreted as a part of a display 220.

According to an embodiment, the electronic device 200 may include at least one of the display 220, audio modules 203, 207, and 214, a sensor module, camera modules 205 and 206, key input devices 217, or connector holes 208 and 209. In some embodiments, the electronic device 200 may not be provided with at least one (e.g., the connector hole 209) of the components or additionally include other components. According to an embodiment, the display 220 may be visually exposed, for example, through a substantial portion of the front plate 202.

According to an embodiment, a surface (or the front plate 202) of the housing 210 may include a view area formed by visual exposure of the display 220. For example, the view area may include the front surface 210A.

In certain embodiments, the electronic device 200 may include a recess or an opening formed in a part of the view area (e.g., the front surface 210A) of the display 220, and include at least one of the audio module 214, a sensor module, a light emitting element, or the camera module 205, which is aligned with the recess or the opening. In certain embodiments, the electronic device 200 may include at least one of the audio module 214, the sensor module, the camera module 205, a fingerprint sensor, or the light emitting element on the rear surface of the view area of the display 220.

In certain embodiments, the display 220 may be incorporated with or disposed adjacent to a touch sensing circuit, a pressure sensor that measures the intensity (pressure) of a touch, and/or a digitizer that detects a magnetic field-based stylus pen.

According to an embodiment, the key input devices 217 may receive a command or data to be used in a component (e.g., a processor) of the electronic device 200 from the outside (e.g., a user) of the electronic device 200. In some embodiments, at least some of the key input devices 217 may be disposed in the side bezel structure 218.

According to an embodiment, the audio modules 203, 207, and 214 may convert a sound to an electrical signal or an electrical signal to a sound. According to an embodiment, the audio modules 203, 207, and 214 may include a microphone hole 203 and speaker holes 207 and 214. A microphone for obtaining an external sound may be disposed in the microphone hole 203, and in some embodiments, a plurality of microphones may be disposed to detect the direction of a sound. The speaker holes 207 and 214 may include an external speaker hole 207 and a receiver hole 214 for calls. In some embodiments, the speaker holes 207 and 214 and the microphone hole 203 may be implemented as a single hole, or a speaker (e.g., a piezo speaker) may be included without the speaker holes 207 and 214.

According to an embodiment, the sensor module may detect an internal operation state (e.g., power or temperature) or external environmental state (e.g., a user state) of the electronic device 200 and generate an electrical signal or data value corresponding to the detected state. According to an embodiment, the sensor module may include, for example, a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

According to an embodiment, the camera modules 205 and 206 may capture a still image and a video. According to an embodiment, the camera modules 205 and 206 may include one or more lenses, image sensors, image signal processors, or flashes. According to an embodiment, the camera modules 205 and 206 may include, for example, a front camera module 205 disposed on the front surface 210A of the electronic device 200, and a rear camera module 206 and/or a flash 204 disposed on the rear surface 210B of the electronic device 200. Each of the camera modules 205 and 206 may include one or more lenses, an image sensor, and/or an image signal processor. The flash 204 may include, for example, a light emitting diode (LED) or a xenon lamp. In some embodiments, two or more lenses (an IR camera, a wide-angle lens, and a telephoto lens) and image sensors may be arranged on one surface of the electronic device 200.

According to an embodiment, the key input devices 217 may be arranged on the side surface 210C of the housing 210. In another embodiment, the electronic device 200 may not include some or any of the above key input devices 217, and the key input devices 217 that are not included may be implemented in other forms such as soft keys on the display 220.

According to an embodiment, the light emitting element may be disposed, for example, on the front surface 210A of the housing 210. The light emitting element may provide, for example, state information about the electronic device 200 in the form of light. In certain embodiments, the light emitting element may provide, for example, a light source interworking with an operation of the front camera module 205. The light emitting element may include, for example, an LED, an IR LED, and/or a xenon lamp.

According to an embodiment, the connector holes 208 and 209 may include a first connector hole 208 that may accommodate a connector (e.g., a universal serial bus (USB) connector) for transmitting and receiving power and/or data to and from an external electronic device and a connector (e.g., an earphone jack) for transmitting and receiving an audio signal to and from an external electronic device, and/or a second connector hole 209 for accommodating a storage device (e.g., a subscriber identity module (SIM) card). According to an embodiment, the connector holes 208 and 209 may include a connector through which the electronic device 200 may be physically coupled to an external electronic device. According to an embodiment, the connector holes 208 and 209 may include, for example, a high-definition multimedia interface (HDMI) connector, a USB connector, a secure digital (SD) card connector, or an audio connector (e.g., a headphone connector).

Figure 3:
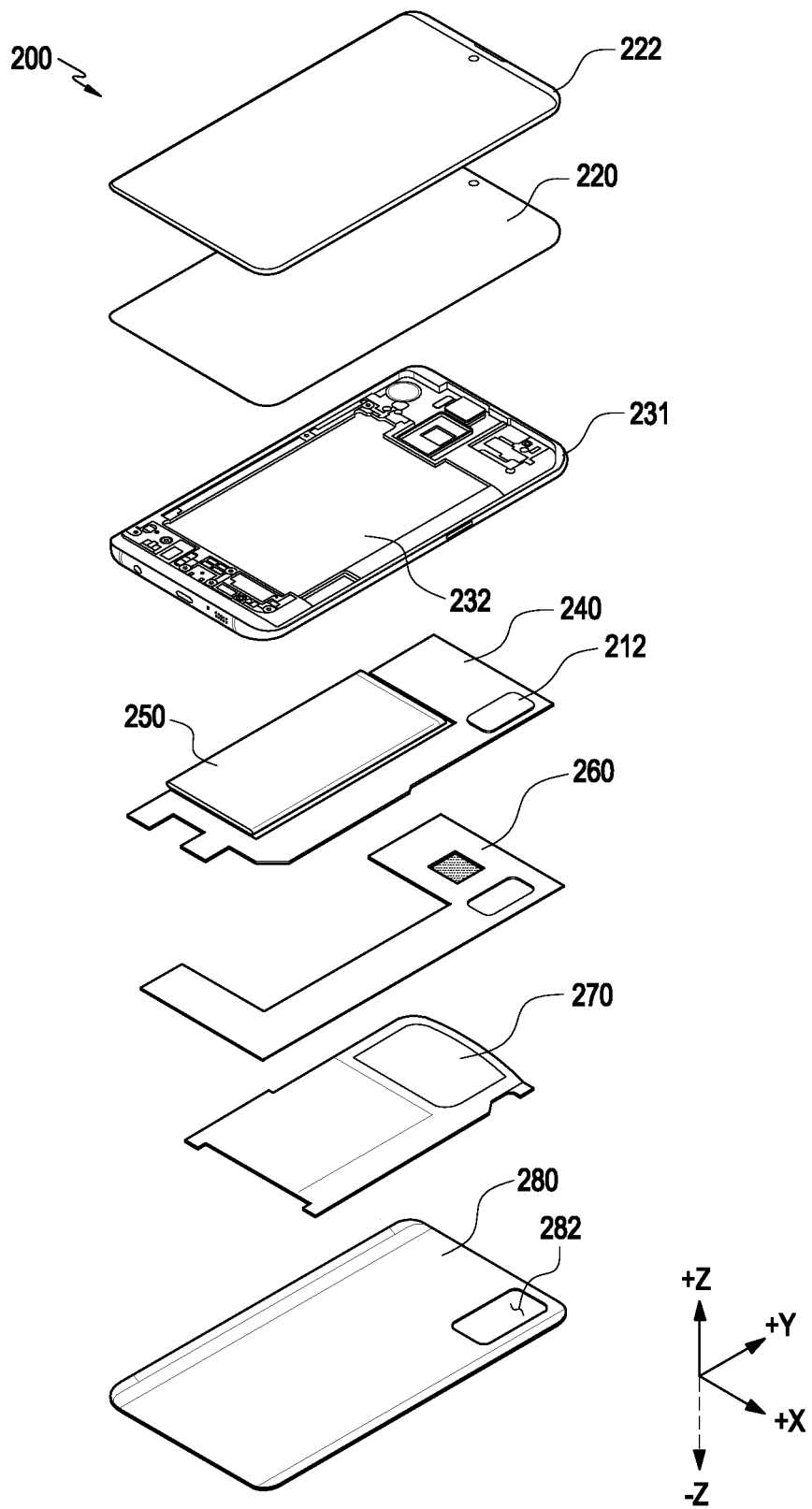
FIG. 3 is an exploded perspective view illustrating an electronic device according to various embodiments of the disclosure.

FIG. 3 is an exploded perspective view illustrating an electronic device according to various embodiments of the disclosure.

Referring to FIG. 3, the electronic device 200 (e.g., the electronic device 200 of FIGS. 1 and 2) may include at least one of a front plate 222 (e.g., the front plate 202 of FIG. 1), the display 220. (e.g., the display 220 of FIG. 1), a first support member 232 (e.g., a bracket), a printed circuit board (PCB) 240, a battery 250, a second support member 260 (e.g., a rear case), an antenna 270, or a rear plate 280 (e.g., the rear plate 211 of FIG. 2). In some embodiments, the electronic device 200 may not be provided with at least one (e.g., the first support member 232 or the second support member 260) of the components or further include other components. At least one of the components of the electronic device 200 may be the same as or similar to at least one of the components of the electronic device 200 illustrated in FIG. 1 or FIG. 2, and a redundant description will be avoided herein.

According to an embodiment, the first support member 232 may be disposed inside the electronic device 200 and coupled to a side bezel structure 231 or integrally formed with the side bezel structure 231. The first support member 232 may be formed of, for example, a metallic material and/or a non-metallic material (e.g., polymer). The first support member 232 may have a surface coupled with the display 220 and another surface coupled with the PCB 240. The PCB 240 may have a processor, a memory, and/or an interface mounted thereon. The processor may include, for example, at least one of a central processing unit (CPU), an application processor, a graphic processing device, an image signal processor, a sensor hub processor, or a communication processor. According to an embodiment, the memory may include, for example, a volatile memory or a non-volatile memory. According to an embodiment, the interface may include, for example, an HDMI, a USB interface, an SD card interface, and/or an audio interface. The interface may electrically or physically couple, for example, the electronic device 200 to an external electronic device, and may include a USB connector, an SD card/multimedia card (MMC) connector, or an audio connector. According to one embodiment, the battery 250 is a device for supplying power to at least one component of the electronic device 200, and may include, for example, a non-rechargeable primary cell, a rechargeable secondary cell, or a fuel battery. At least a part of the battery 250 may be disposed on the substantially same plane with, for example, the PCB 240. The battery 250 may be integrally disposed inside the electronic device 200, or may be disposed detachably from the electronic device 200.

According to an embodiment, the second support member 260 (e.g., the rear case) may be disposed between the PCB 240 and the antenna 270. For example, the second support member 260 may include a surface coupled with at least one of the PCB 240 or the battery 250 and the other surface coupled with the antenna 270.

According to an embodiment, the antenna 270 may be disposed between the rear plate 280 and the battery 250. The antenna 270 may include, for example, a near field communication (NFC) antenna, a wireless charging antenna, and/or a magnetic secure transmission (MST) antenna. The antenna 270 may, for example, perform short-range communication with an external device or wirelessly transmit and receive power required for charging to and from an external device. For example, the antenna 270 may include a coil for wireless charging. In another embodiment, an antenna structure may be formed by a part of the side bezel structure 231 and/or the first support member 232 or a combination thereof.

According to various embodiments, the electronic device 200 may include a camera module 212 disposed inside a housing (e.g., the housing 210 of FIG. 2). The camera module 212 may be a rear camera module (e.g., the camera module 206 of FIG. 2) which is disposed on the first support member 232, and may obtain an image of an object located behind the electronic device 200 (e.g., in a −Z direction). According to an embodiment, at least a part of the camera module 212 may be visually exposed to the outside of the electronic device 200 through an opening 282 formed in the rear plate 280.

The electronic device 200 illustrated in FIGS. 1, 2 and 3 has a bar-type or plate-type outward appearance, which should not be construed as limiting the disclosure. For example, the illustrated electronic device may be a rollable electronic device or a foldable electronic device. A "rollable electronic device" refers to an electronic device in which a display (e.g., the display 220 of FIG. 3) is bendable to be deformed and thus at least partially wound or rolled or accommodated into the housing (e.g., the housing 210 of FIG. 1). According to user need, the rollable electronic device may extend a view area by unfolding the display or exposing a larger area of the display to the outside. A "foldable electronic device" may refer to an electronic device in which a display is foldable such that two different areas of the display face each other or in opposite directions. In general, the display may be folded with two different areas facing each other or in opposite directions in a portable state, whereas the user may unfold the display and make the two different areas substantially flat in an actual use state, in the foldable electronic device. In some embodiments, the electronic device 200 may be interpreted as including not only a portable electronic device such as a smart phone but also various other electronic devices such as a laptop computer, a wearable electronic device (e.g., a smart watch), or a camera.

In various embodiments of the disclosure, a cutting process may mean a machining process. For example, the cutting process and/or the machining process may refer to a process of making a material (workpiece) into a desired shape by cutting, drilling a hole, or the like while relatively moving the material and a tool.

Figure 4:
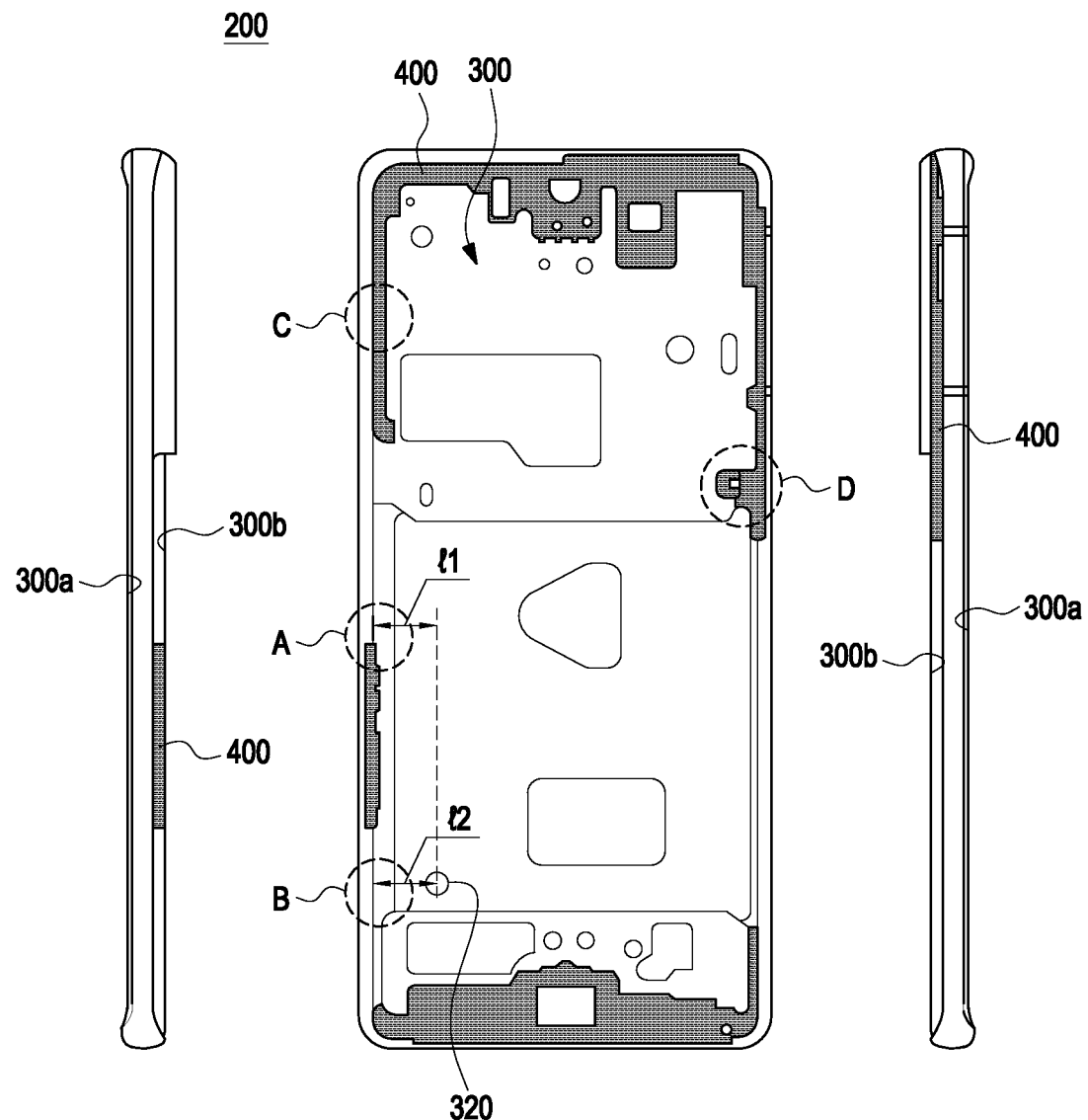
FIG. 4 is a diagram illustrating an electronic device including a support member and an indicator according to various embodiments of the disclosure.
Figure 5A:
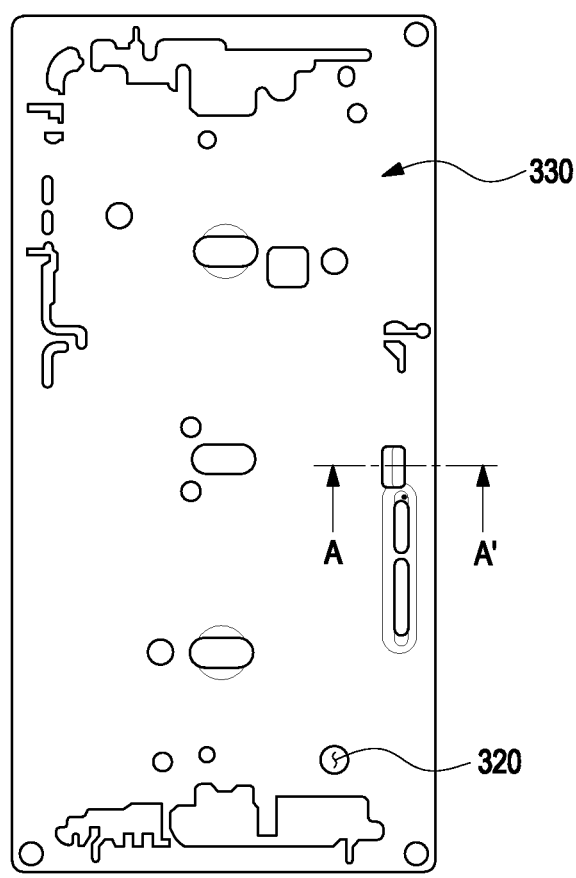
FIG. 5A is a diagram illustrating the structure of a support member before a cutting process is performed according to various embodiments of the disclosure.

FIG. 4 is a diagram illustrating an electronic device including a support member and an indicator according to various embodiments of the disclosure. FIG. 5A is a diagram illustrating the structure of a support member before a cutting process is performed according to various embodiments of the disclosure, and FIG. 5B is a cross-sectional view taken along line A-A' of FIG. 5A.

Figure 5B:
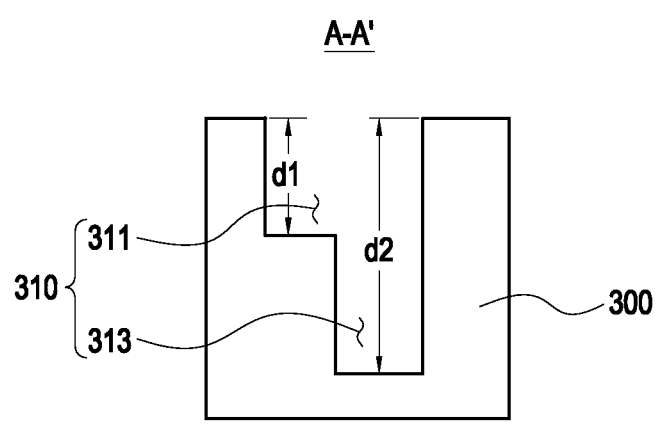
FIG. 5B is a cross-sectional view taken along line A-A' of FIG. 5A.

Referring to FIGS. 4, 5A and 5B, the electronic device 200 may include a support member 300 and an indicator 400. The configuration of the support member 300 and/or the indicator 400 illustrated in FIG. 4, FIG. 5A, and/or FIG. 5B may be wholly or partially identical to that of the first support member 232 illustrated in FIG. 3. For example, the support member 300 or the support member 300 coupled with the indicator 400 may be interpreted as the single first support member 232. In another example, the support member 300 may be interpreted as the first support member 232.

According to various embodiments, the support member 300 may be a support structure supporting a component (e.g., the camera module 212, the display 220, the rear plate 280, and/or the battery 250 of FIG. 3) of the electronic device 200. According to an embodiment, the support member 300 may be formed by using a cut-processed metal member 330. The support member 300 may provide a space in which components of the electronic device 200 are accommodated. According to an embodiment, the support member 300 may include a first surface 300a supporting a component (e.g., the display 220 of FIG. 2) of the electronic device 200 and a second surface 300b opposite to the first surface 300a. According to an embodiment, the first surface 300a and/or the second surface 300b may be a curved surface forming at least a part of the periphery of the support member 300.

According to various embodiments, the support member 300 may be formed of a first material (e.g., metal). For example, the support member 300 may include at least one of aluminum, stainless steel, titanium, and magnesium.

According to various embodiments, the support member 300 may include at least one accommodation space 310 for accommodating the indicator 400 therein. According to an embodiment, at least a part of the indicator 400 that has been inserted into the accommodation space 310 may be cut together with the support member 300. According to an embodiment, the accommodation space 310 may be interpreted as a groove or a through hole. According to an embodiment, the accommodation space 310 may include a plurality of grooves or through holes having different thicknesses. For example, the accommodation space 310 may include a first groove 311 and a second groove 313 extending from the first groove 311. The first groove 311 may be formed to a first depth d1, and the second groove 313 may be formed to a second depth d2 different from the first depth d1. For example, the second depth d2 may be greater than the first depth d1. According to an embodiment, the first groove 311 may accommodate a part of the indicator 400 (e.g., a first area 410 of FIG. 9B), and the second groove 313 may accommodate another part (e.g., a second area 420 of FIG. 9B) of the indicator 400. According to an embodiment, at least a part of the metal member 330 surrounding at least a part of the accommodation space 310 may be cut during a cutting process for forming the support member 300. At least a part of the accommodation space 310 may be modified to the shape of a through hole.

According to various embodiments, the support member 300 may include at least one recess 320. According to an embodiment, the recess 320 may be spaced apart from the indicator 400 and/or the accommodation space 310. For example, according to an embodiment, the recess 320 may be a processed structure formed in the support member 300. For example, the recess 320 may be interpreted as a groove or a through hole formed into a surface (e.g., the first surface 300a or the second surface 300b) of the support member 300.

According to various embodiments, the indicator 400 may be used as an indication mark for processing the support member 300. According to an embodiment, at least a part of the indicator 400 may be visually exposed to the outside of the support member 300. In a manufacturing process of the electronic device 200, a degree to which the support member 300 has been processed may be determined based on the distance between the recess 320 and the indicator 400. According to an embodiment, whether the support member 300 is defective may be determined based on the distance between the recess 320 and the indicator 400. For example, at least a part (e.g., a third surface 400a of FIG. 6B) of the indicator 400 located in an area A of the support member 300 and visually exposed to the outside of the support member 300 may be formed to be spaced apart from the recess 320 by a first distance l1. At least a part (e.g., the third surface 400a of FIG. 9D) of the indicator 400 located in an area B of the support member 300 and visually exposed to the outside of the support member 300 may be formed to be spaced apart from the recess 320 by a second distance 12. According to an embodiment, whether the support member 300 has been properly cut may be identified based on the first distance 11 and/or the second distance 12 in the manufacturing process of the electronic device 200.

According to various embodiments, at least a part of the indicator 400 may be inserted into the accommodation space 310. For example, the indicator 400 may be formed in the accommodating space 310 of the support member 300 by insert-injection. According to an embodiment, the indicator 400 may be coupled with the support member 300 by injection-molding the support member 300. According to an embodiment, at least a part of the indicator 400 inserted into the accommodation space 310 of the support member 300 may be cut together with the support member 300 (e.g., by computer numerical control (CNC) processing).

According to various embodiments, the indicator 400 may be formed of a second material. According to an embodiment, the indicator 400 may be formed of the second material different from the first material of the support member 300. According to an embodiment, the second material may include a non-metal (e.g., a resin).

Figure 6A:
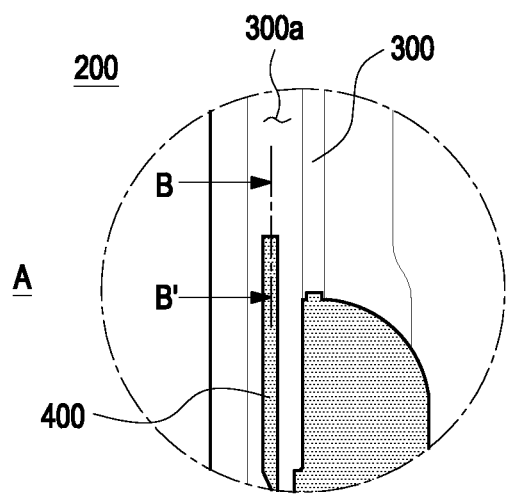
FIG. 6A is an enlarged view illustrating an area A of FIG. 4 according to various embodiments of the disclosure.
Figure 6B:
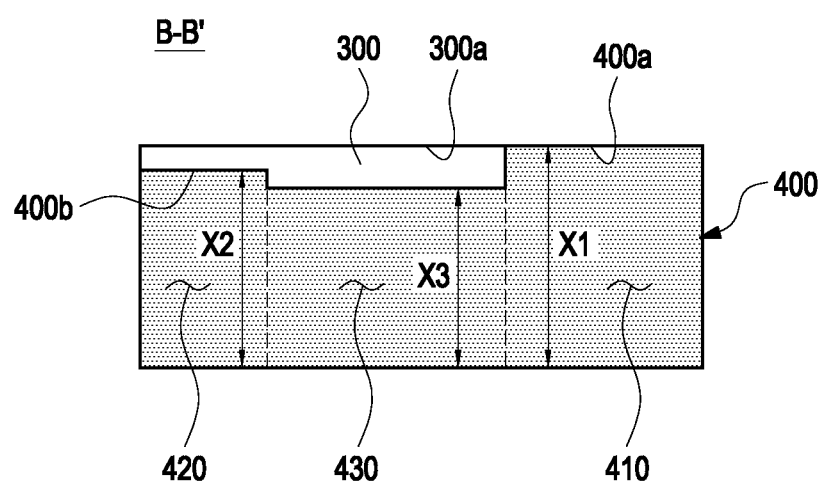
FIG. 6B is a cross-sectional view taken along line B-B' of FIG. 6A.
Figure 6C:
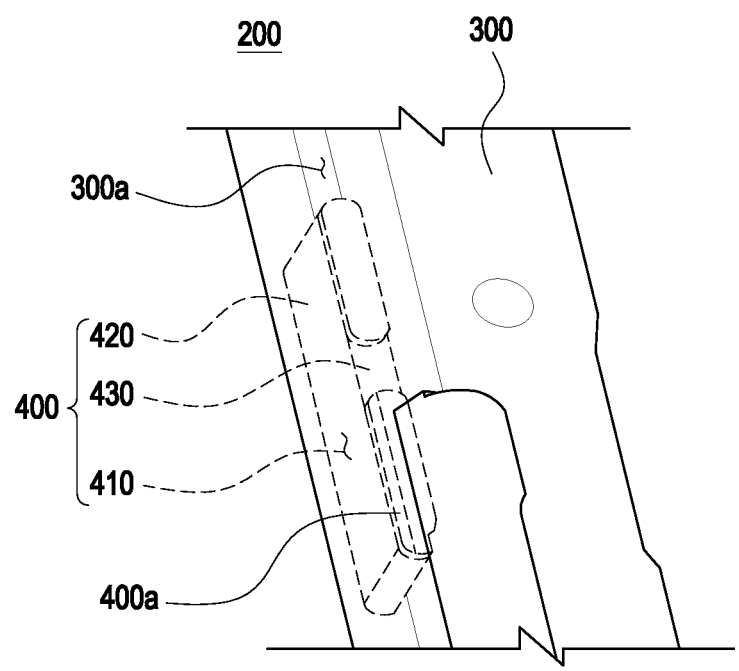
FIG. 6C is a projection view of FIG. 6A.
Figure 7A:
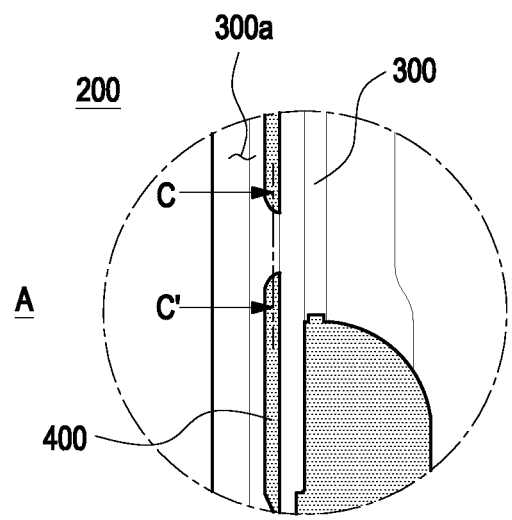
FIG. 7A is an enlarged view illustrating the area A of FIG. 4 according to various embodiments of the disclosure.
Figure 7B:
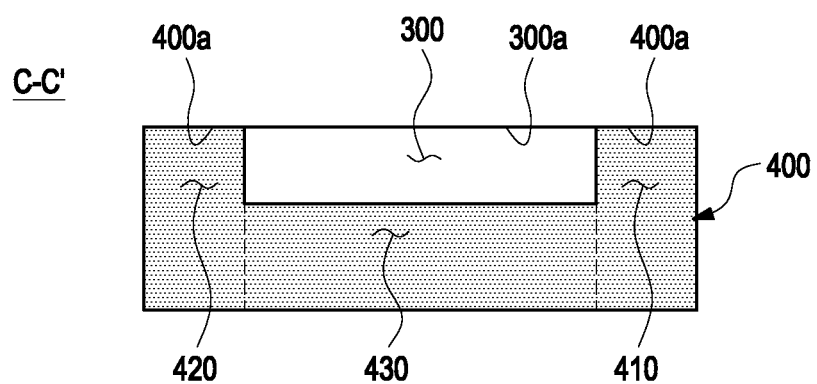
FIG. 7B is a cross-sectional view taken along line C-C' of FIG. 7A.
Figure 8A:
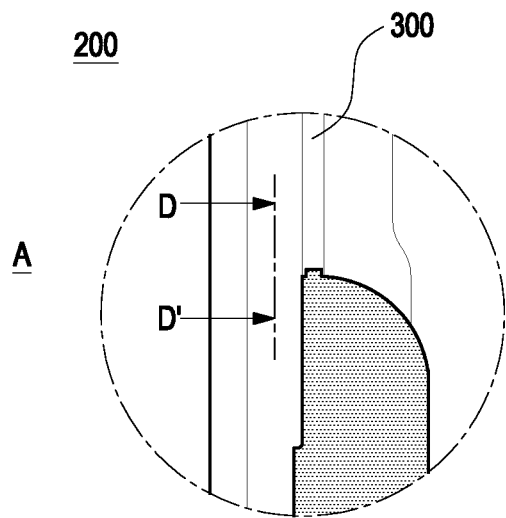
FIG. 8A is an enlarged view illustrating the area A of FIG. 4 according to various embodiments of the disclosure.
Figure 8B:
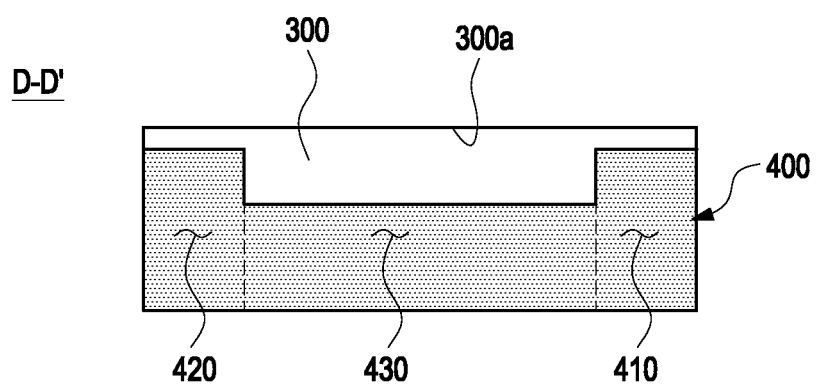
FIG. 8B is a cross-sectional view taken along line D-D' of FIG. 8A.
Figure 9A:
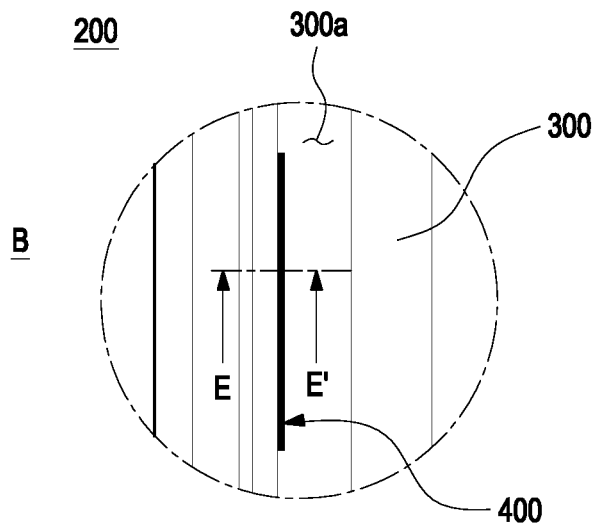
FIG. 9A is an enlarged view illustrating an area B of FIG. 4 according to various embodiments of the disclosure.
Figure 9B:
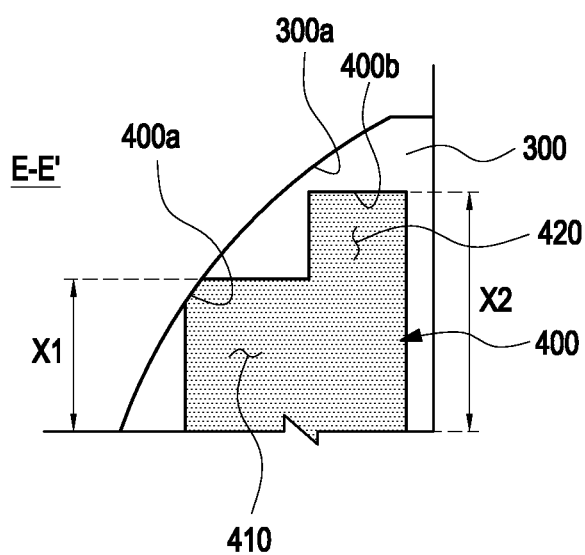
FIG. 9B is a cross-sectional view taken along line E-E' of FIG. 9A.
Figure 9C:
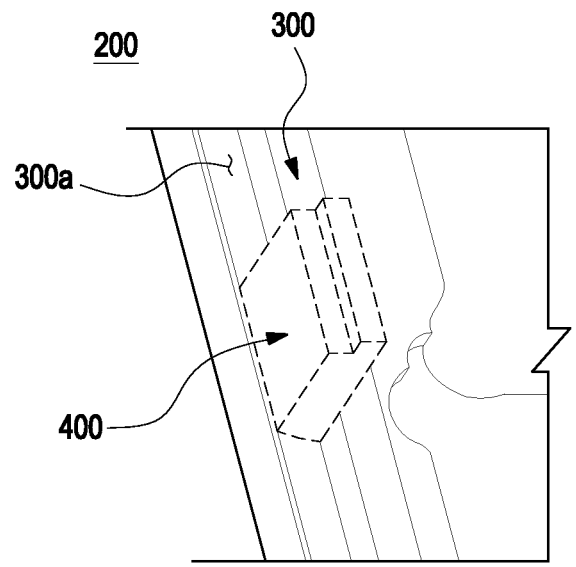
FIG. 9C is a projection view of FIG. 9A.
Figure 9D:
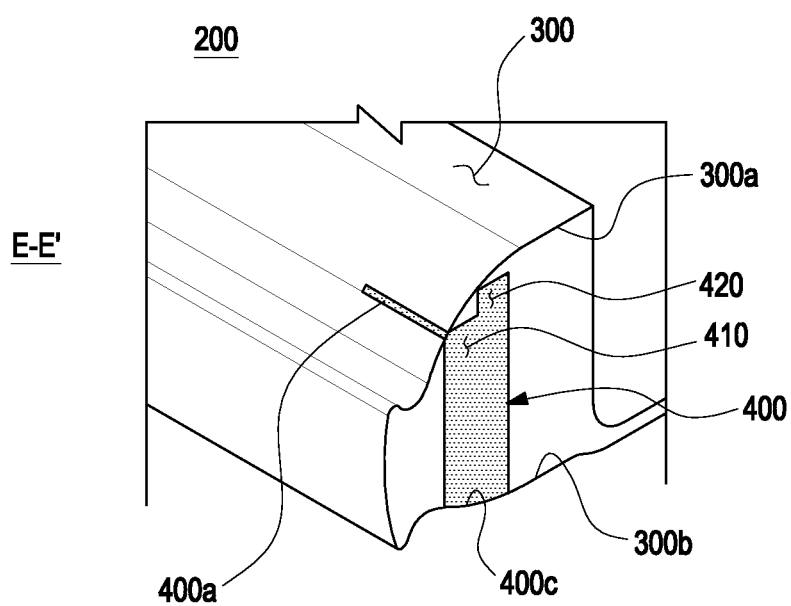
FIG. 9D is a cross-sectional perspective view of FIG. 9A.
Figure 10A:
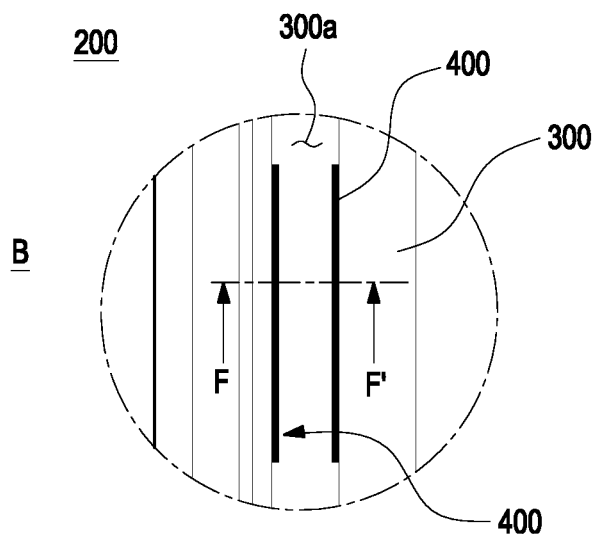
FIG. 10A is an enlarged view illustrating the area B of FIG. 4 according to various embodiments of the disclosure.
Figure 10B:
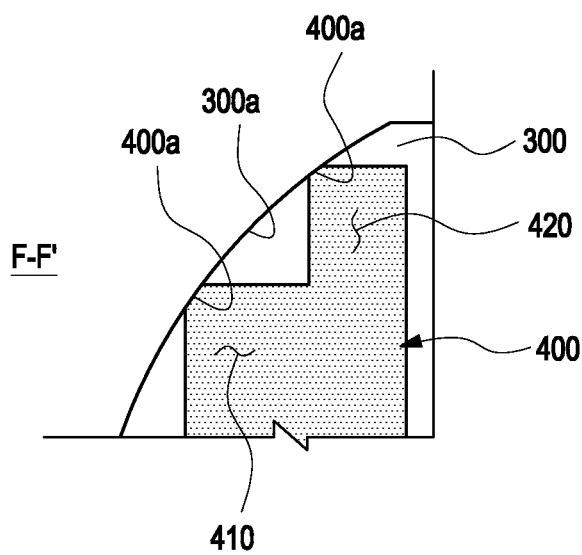
FIG. 10B is a cross-sectional view taken along line F-F' of FIG. 10A.
Figure 10C:
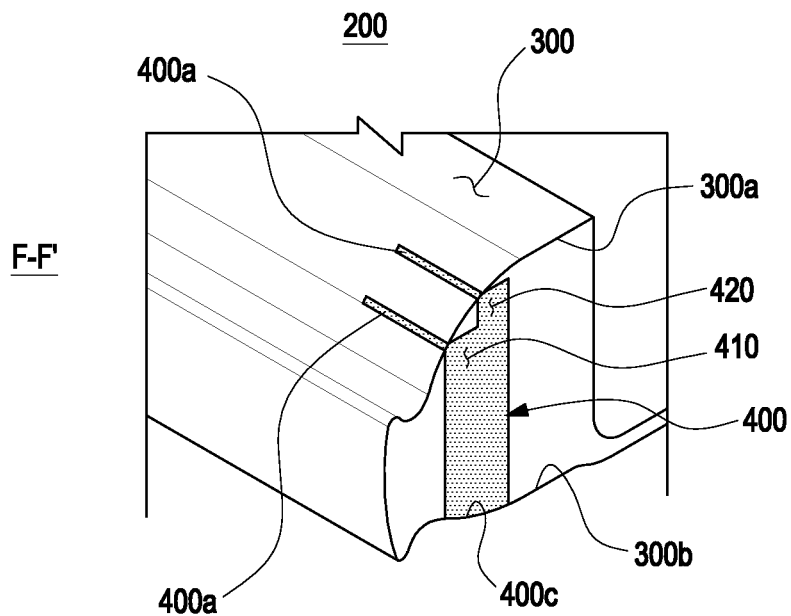
FIG. 10C is a cross-sectional perspective view of FIG. 10A.
Figure 11A:
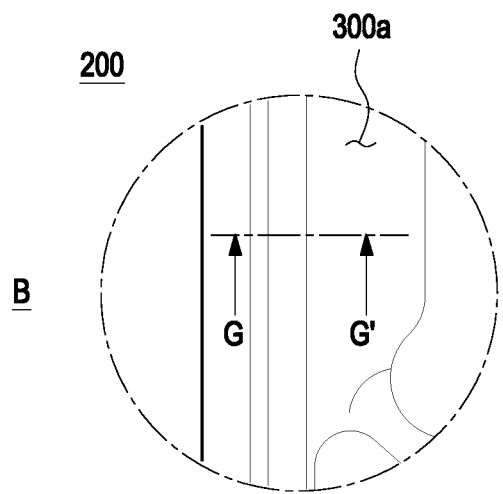
FIG. 11A is an enlarged view illustrating the area B of FIG. 4 according to various embodiments of the disclosure.
Figure 11B:
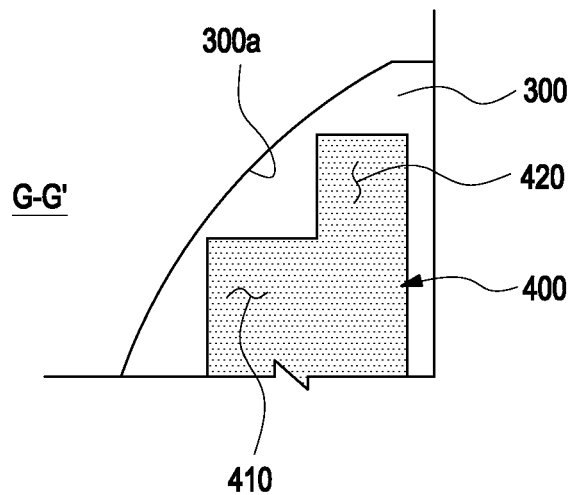
FIG. 11B is a cross-sectional view taken along line G-G' of FIG. 11A.
Figure 11C:
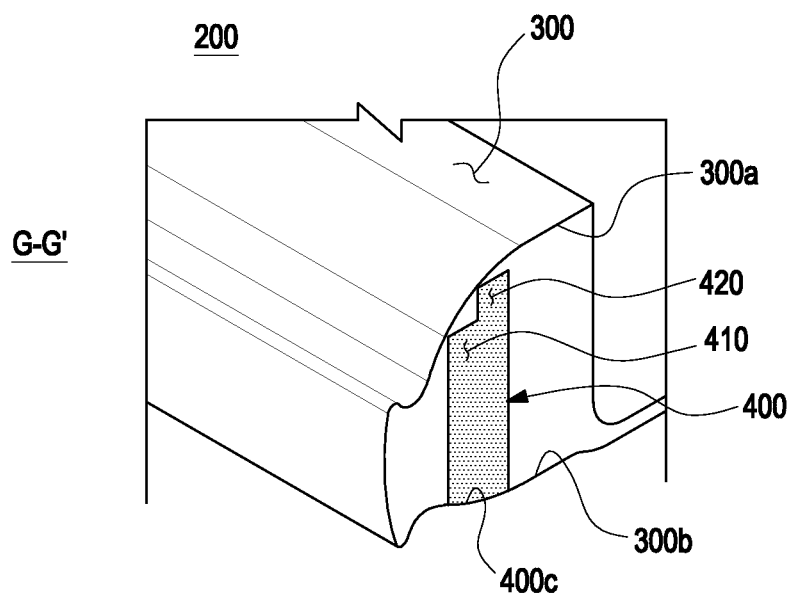
FIG. 11C is a cross-sectional perspective view of FIG. 11A.

FIG. 6A is an enlarged view illustrating an area A of FIG. 4 according to various embodiments of the disclosure, FIG. 6B is a cross-sectional view taken along line B-B' of FIG. 6A, and FIG. 6C is a projection view of FIG. 6A. FIG. 7A is an enlarged view illustrating the area A of FIG. 4 according to various embodiments of the disclosure, and FIG. 7B is a cross-sectional view taken along line C-C' of FIG. 7A. FIG. 8A is an enlarged view illustrating the area A of FIG. 4 according to various embodiments of the disclosure, and FIG. 8B is a cross-sectional view taken along line D-D' of FIG. 8A. FIG. 9A is an enlarged view illustrating an area B of FIG. 4 according to various embodiments of the disclosure, FIG. 9B is a cross-sectional view taken along line E-E' of FIG. 9A, FIG. 9C is a projection view of FIG. 9A, and FIG. 9D is a cross-sectional perspective view of FIG. 9A. FIG. 10A is an enlarged view illustrating the area B of FIG. 4 according to various embodiments of the disclosure, FIG. 10B is a cross-sectional view taken along line F-F' of FIG. 10A, and FIG. 10C is a cross-sectional perspective view of FIG. 10A. FIG. 11A is an enlarged view illustrating the area B of FIG. 4 according to various embodiments of the disclosure, FIG. 11B is a cross-sectional view taken along line G-G' of FIG. 11A, and FIG. 11C is a cross-sectional perspective view of FIG. 11A.

The area A and the area B may be interpreted as at least a part of the curved surface of the support member 300.

Referring to FIGS. 6A to 11C, the degree to which the indicator 400 is exposed to the outside of the support member 300 may be changed based on the degree to which the support member 300 and the indicator 400 are cut-processed. The configuration of the support member 300 and/or the indicator 400 of FIGS. 6A to 11C may be wholly or partially identical to of that of the support member 300 and/or the indicator 400 of FIG. 4.

According to various embodiments, at least a part of the indicator 400 may be visually exposed to the outside of the support member 300. For example, at least a part of the indicator 400 may be cut together with at least a part of the support member 300. As the indicator 400 is cut together with the support member 300, the third surface 400a of the indicator 400 may form substantially the same surface with the first surface 300a of the support member 300.

According to various embodiments, a shape in which the indicator 400 is exposed to the outside of the support member 300 may be changed based on a degree (e.g., a thickness) to which the support member 300 is cut. According to an embodiment, the indicator 400 may include the first area 410 and the second area 420. The thickness (or height) of the first area 410 may be different from the thickness (or height) of the second area 420. For example, the first area 410 may have a first length X1, and the second area 420 may have a second length X2 different from the first length X1. According to an embodiment (e.g., FIGS. 6A to 8D), the first length X1 of the first area 410 may be greater than the second length X2 of the second area 420. According to an embodiment (e.g., FIGS. 9A to 11C), the first length X1 of the first area 410 may be less than the second length X2 of the second area 420.

According to various embodiments (e.g., FIGS. 6A to 8D), the indicator 400 may include a third area 430 positioned between the first area 410 and the second area 420. The third area 430 may be formed having a third length X3 less than the first length X1 or the second length X2. According to an embodiment, the first area 410, the second area 420, and/or the third area 430 may be interpreted as an area differentiated in terms of thickness in the single indicator 400.

According to various embodiments (e.g., FIGS. 9A to 11C), the first area 410 and the second area 420 may be formed into repeated shapes. According to one embodiment, although the first area 410 may be formed into substantially the same shape as the second area 420, the ratios of size (e.g., width or height) of the first area 410 and size of the second area 420 may be the same or different. According to an embodiment, the first area 410 and the second area 420 may be formed having the shape of a step. According to an embodiment, the second area 420 may protrude while extending from the first area 410. According to an embodiment, the first area 410 and the second area 420 may be formed having the shape of a prefabricated blocks (e.g., Lego™ blocks). According to an embodiment, the first area 410 and the second area 420 may be formed having the shape of pillars. For example, the first area 410 and the second area 420 may be formed having the shape of cylinders or polygonal (e.g., square or hexagonal) columns. According to various embodiments (e.g., FIGS. 6A, 6B, 6C, 9A, 9B, 9C, and 9D), the indicator 400 may be visually exposed at a point to the outside of the support member 300. For example, at least a part of the first area 410 of the indicator 400 may be visually exposed to the outside of the support member 300. The second area 420 and/or the third area 430 may be covered by the support member 300 and may not be visually exposed to the outside of the support member 300. According to an embodiment, an outer surface (e.g., the third surface 400a) of the first area 410 may be substantially the same as an outer surface (e.g., the first surface 300a) of the support member 300. According to an embodiment, an outer surface (e.g., a fourth surface 400b) of the second area may be located below the support member 300. According to one embodiment, the support member 300 of FIGS. 6A to 6C and FIGS. 9A to 9D may be in an optimal cutting state.

According to an embodiment (e.g., FIGS. 7A, 7B, 10A, 10B, and 10C), the indicator 400 may be visually exposed at a plurality (e.g., two or more) of points to the outside of the support member 300. For example, at least a part of the first area 410 and at least a part of the second area 420 of the indicator 400 may be visually exposed to the outside of the support member 300. According to an embodiment, the third area 430 may be covered by the support member 300 and may not be visually exposed to the outside of the support member 300. According to an embodiment, the outer surfaces (e.g., the third surface 400a) of the first area 410 and the second area 420 may form substantially the same surface with the outer surface (e.g., the first surface 300a) of the support member 300. According to an embodiment, the support member 300 of FIGS. 7A and 7B and FIGS. 10A to 10C may be in an over-cutting state.

According to an embodiment (e.g., FIGS. 8A, 8B, 11A, 11B, and 11C), the indicator 400 may not be exposed at a specified position to the outside of the support member 300. For example, the first area 410, the second area 420, and/or the third area 430 of the indicator 400 may be covered by the support member 300, and may not visually exposed to the outside of the support member 300. According to an embodiment, the support member 300 of FIGS. 8A and 8B and FIGS. 11A to 11C may be in an insufficient cutting state.

According to an embodiment, a manufacturer of the electronic device 200 may determine whether the support member 300 is defective based on the number of indicators 400 exposed to the outside of the support member 300 in a manufacturing process of the electronic device 200. For example, an electronic device 200 and/or a support member 300 including an indicator 400 exposed at one point in a specific spot (e.g., the area A) to the outside of the support member 300 may be determined to have been excessively cut (e.g., overcut), and an electronic device 200 and/or a support member 300 including an indicator 400 not exposed to the outside of the support member 300 may be determined to have been cut thinner than a normal processed product (e.g., insufficiently cut)

According to an embodiment (not shown), whether the support member 300 is defective may be determined based on the thickness of a part (e.g., the third surface 400a) of the indicator 400 exposed to the outside of the support member 300. For example, when the thickness of the third surface 400a exceeds a specified value, the manufacturer of the electronic device 200 may determine that the support member 300 has been cut much more than a normal processed product, and when the thickness of the third surface 400a is less than the specified value, the manufacturer of the electronic device 200 may determine that the support member 300 has been cut thinner than the normal processed product.

According to an embodiment, whether the support member 300 is defective may be determined based on the shape of the part (e.g., the third surface 400a) of the indicator 400 exposed to the outside of the support member 300. For example, when the shape, length, and/or area of the part (e.g., the third surface 400a) of the support member 300 exposed to the outside of the support member 300 deviates from a reference, the support member 300 may be determined to have been cut more or less than a normal processed product.

According to various embodiments (e.g., FIGS. 9D, 10C and 11C), the indicator 400 may include a fifth surface 400c opposite to the third surface 400a. The fifth surface 400c may form substantially the same surface with the second surface 300b of the support member 300. According to an embodiment, the indicator 400 may be inserted into the support member 300 (e.g., the accommodation space 310 of FIG. 5B) through the fifth surface 400c.

Although the first area 410, the second area 420, and/or the third area 430 is shown as shaped into a rectangle and/or a pentagon in the disclosure, the first area 410 and the second area 420 are) and/or the third area 430 is not limited to the shapes. For example, the first area 410 and/or the second area 420 may be formed having the shape of a polygon (e.g., a triangle), or formed to be at least partially a curved surface. According to an embodiment, the indicator 400 may be interpreted as a plurality of protrusions (e.g., the first area 410 and/or the second area 420 of FIG. 9B) which are shaped into polygons (e.g., triangles, quadrangles, or pentagons) and/or which are formed to be at least partially curved surfaces.

Figure 12A:
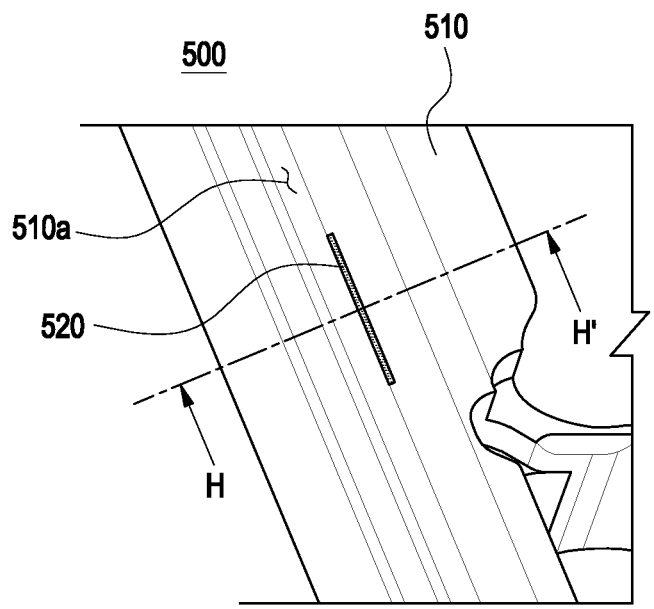
FIG. 12A is an enlarged view illustrating the area B of FIG. 4 according to various embodiments of the disclosure.
Figure 12B:
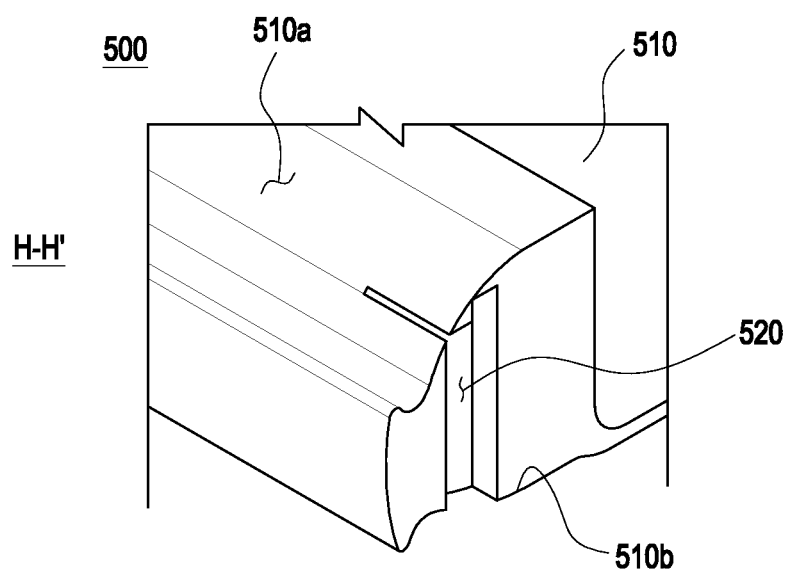
FIG. 12B is a cross-sectional view taken along line H-H' of FIG. 12A.

FIG. 12A is an enlarged view illustrating the area B of FIG. 4 according to various embodiments of the disclosure, and FIG. 12B is a cross-sectional view taken along line H-H' of FIG. 12A.

Referring to FIGS. 12A and 12B, an electronic device 500 may include a support member 510 and an indicating space 520. The configurations of the electronic device 500 and the support member 510 of FIGS. 12A and 12B may be wholly or partially identical to those of the electronic device 200 and the support member 300 of FIG. 9D.

According to various embodiments, the indicating space 520 may be used as an indication mark for processing the support member 510. For example, the configuration of the indicating space 520 may be wholly or partially identical to that of an indicator (e.g., the indicator 400 of FIG. 9D). According to an embodiment, the indicating space 520 may be a through hole formed between a first surface 510a of the support member 510 and a second surface 510b opposite to the first surface 510a. According to an embodiment, at least a part of the indicating space 520 may be visually exposed to the outside of the support member 510. In a manufacturing process of the electronic device 500, a degree to which the support member 300 has been processed may be determined based on the distance between the indicating space 520 and a recess (e.g., the recess 320 of FIG. 5A).

Figure 13A:
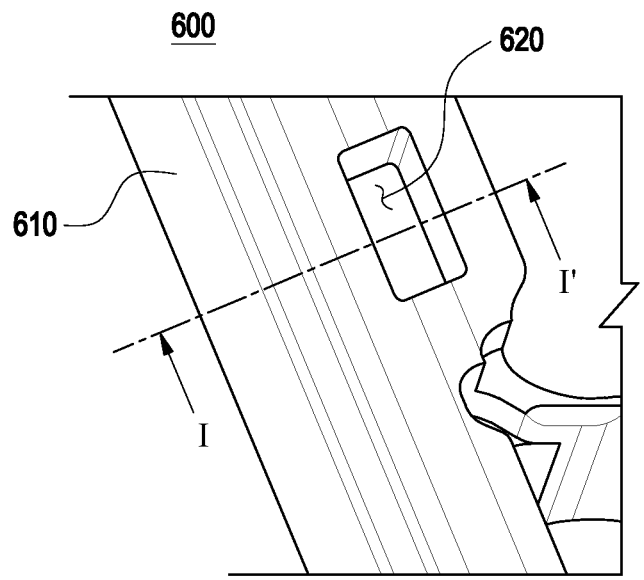
FIG. 13A is an enlarged view illustrating the area B of FIG. 4 according to various embodiments of the disclosure.
Figure 13B:
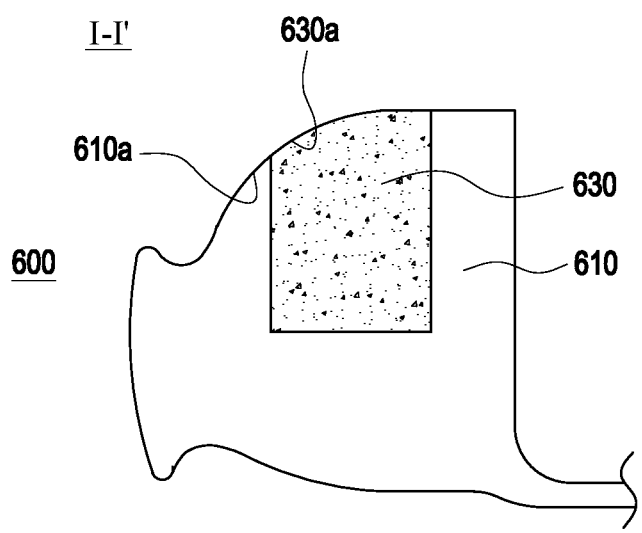
FIG. 13B is a cross-sectional view illustrating an inserted metal member, taken along line I-I' of FIG. 13A.

FIG. 13A is an enlarged view illustrating the area B of FIG. 4 according to various embodiments of the disclosure, and FIG. 13B is a cross-sectional view illustrating an inserted metal member, taken along line I-I' of FIG. 13A.

Referring to FIGS. 13A and 13B, an electronic device 600 may include a support member 610 and an indicating member 630. The configurations of the electronic device 600 and the support member 610 of FIGS. 13A and 13B may be wholly or partially identical to those of the electronic device 200 and the support member 300 of FIG. 9D.

According to various embodiments, the support member 610 may include at least one groove structure 620 for accommodating the indicating member 630. The groove structure 620 may be formed in a first surface 610a of the support member 610.

According to various embodiments, the indicating member 630 may be used as an indication mark for processing the support member 610. According to an embodiment, the indicating member 630 may be formed of a first material (e.g., metal). For example, the indicating member 630 may include at least one of aluminum, stainless steel, titanium, or magnesium.

According to various embodiments, whether the support member 610 is defective may be determined by using the indicating member 630 (e.g., metal member). According to an embodiment, a degree to which the support member 610 has been cut may be determined based on the distance (e.g., step difference) between the support member 610 and the indicating member 630. According to an embodiment, the processed dimensions of the support member 610 may be determined based on the distance between the first surface 610a of the support member 610 and a surface 630a of the indicating member 630 and the distance between the first surface 610a of the support member 610 and a recess (e.g., the recess 320 of FIG. 5A).

Figure 14A:
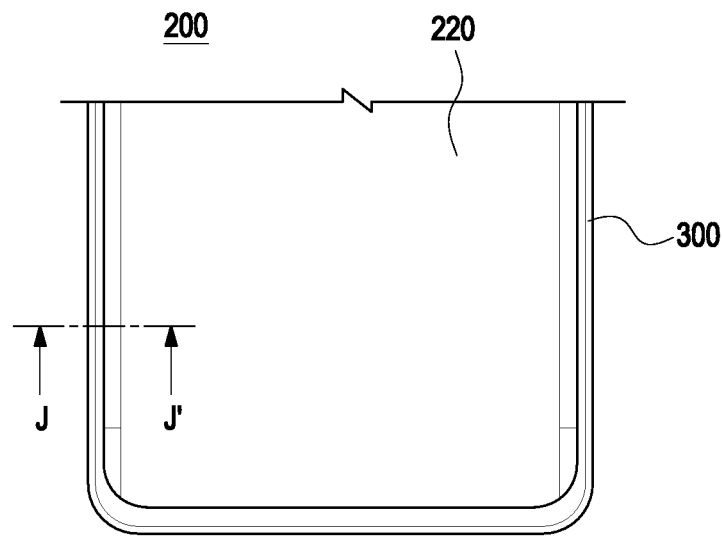
FIG. 14A is a front view illustrating an electronic device including a display according to various embodiments of the disclosure.
Figure 14B:
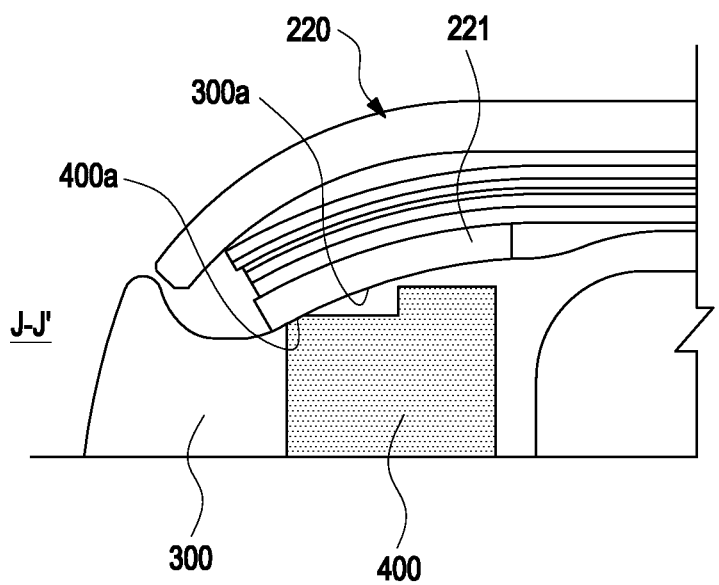
FIG. 14B is a cross-sectional view taken along line J-J' of FIG. 14A.
Figure 15A:
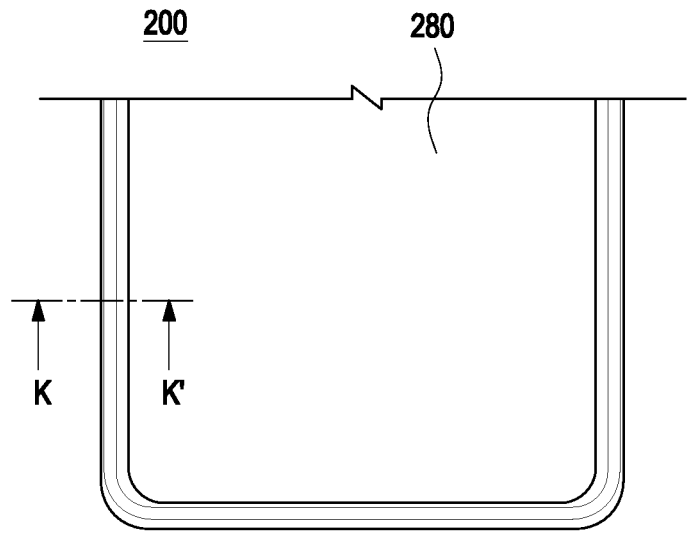
FIG. 15A is a front view illustrating an electronic device including a rear plate according to various embodiments of the disclosure.
Figure 15B:
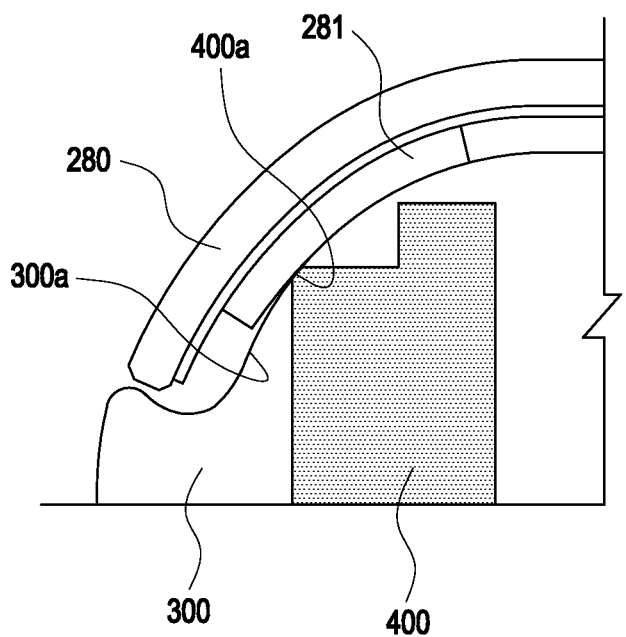
FIG. 15B is a cross-sectional view taken along line K-K' of FIG. 15A.
Figure 16:
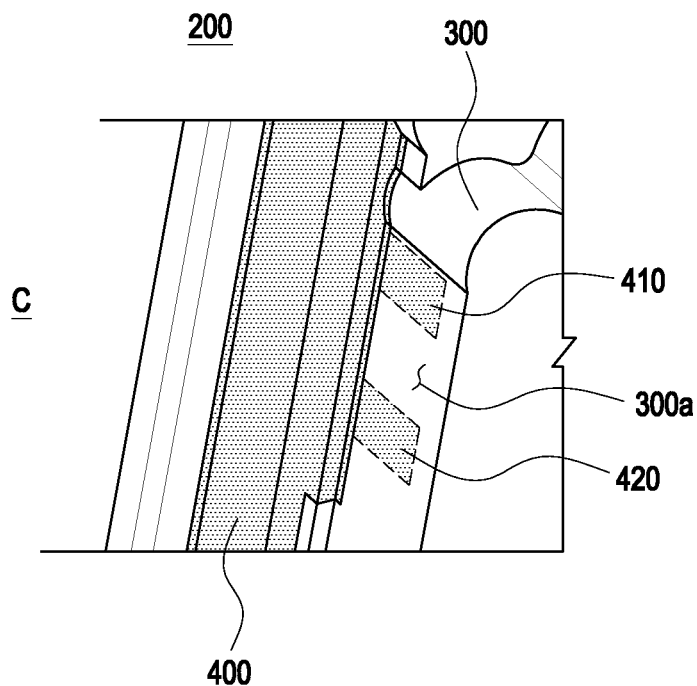
FIG. 16 is an enlarged view illustrating an area C of FIG. 4 according to various embodiments of the disclosure.
Figure 17:
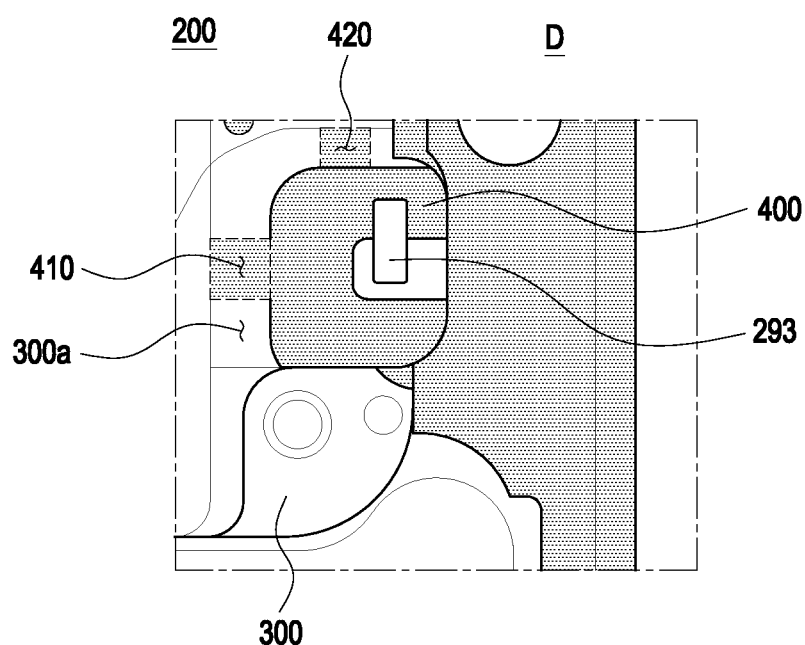
FIG. 17 is an enlarged view illustrating the area D of FIG. 4 according to various embodiments of the disclosure.

FIG. 14A is a front view illustrating an electronic device including a display according to various embodiments of the disclosure, and FIG. 14B is a cross-sectional view taken along line J-J' of FIG. 14A. FIG. 15A is a front view illustrating an electronic device including a rear plate according to various embodiments of the disclosure, and FIG. 15B is a cross-sectional view taken along line K-K' of FIG. 15A. FIG. 16 is an enlarged view illustrating an area C of FIG. 4 according to various embodiments of the disclosure. FIG. 17 is an enlarged view illustrating area D of FIG. 4 according to various embodiments of the disclosure. Referring to FIGS. 14A, 14B, 15A, 15B, 16, and 17, at least one indicator 400 may be provided at various positions of the electronic device 200. The configurations of the electronic device 200, the support member 300, and the indicator 400 of FIGS. 14A, 14B, 15A, 15B, 16, and 17 may be wholly or partially identical to those of the electronic device 200, the support member 300, and the indicator 400.

According to an embodiment, a position at which a component (e.g., the display 220, the rear plate 280, the camera module 212 of FIG. 3, and a connection member 293 of the electronic device 200 is to be attached may be indicated by the indicator 400. According to an embodiment, the dimensions of the support member 300 at a point where a component of the electronic device 200 is to be disposed may be measured by using the indicator 400. For example, whether the cutting process of the support member 300 in which the component of the electronic device 200 is to be accommodated is defective may be determined based on a degree to which the indicator 400 is exposed. For example, the indicator 400 may include the first area 410 and the second area 420 having a thickness different from that of the first area 410. The cutting range of the support member 300 may be determined to be appropriate, when the first area 410 is visually exposed to the outside of the support member 300 and the second area 420 is not visually exposed to the outside of the support member 300.

According to various embodiments (e.g., FIGS. 14A and 14B), the electronic device 200 may include the display 220 (e.g., the display 220 of FIG. 3) disposed on the support member 300. For example, the display 220 may be attached to the support member 300 by using a first adhesive member 221 (e.g., an optically clear adhesive). According to an embodiment, the display 220 may face the support member 300 and the indicator 400. For example, at least a part of the display 220 may face the first surface 300a and the third surface 400a of the support member 300.

According to various embodiments (e.g., FIGS. 15A and 15B), the electronic device 200 may include the rear plate 280 (e.g., the back plate 280 of FIG. 3) disposed on the support member 300. For example, the rear plate 280 may be attached to the support member 300 by using a second adhesive member (e.g., a double-sided tape) 281. According to an embodiment, the rear plate 280 may face the support member 300 and the indicator 400. For example, at least a part of the rear plate 280 may face the first surface 300a and the third surface 400a of the support member 300.

According to various embodiments (e.g., FIG. 16), the support member 300 may accommodate at least one electronic component (e.g., the camera module 212 and/or a speaker module of FIG. 3) of the electronic device 200. For example, according to an embodiment, the first surface 300a of the support member 300 may surround at least a part of the electronic component. According to an embodiment, the electronic component may face the support member 300 and the indicator 400. For example, at least a part of the electronic component may face the third surface (e.g., the third surface 400a of FIG. 6B) of the support member 300. According to an embodiment, the first surface 300a may be an inner surface of the support member 300.

According to various embodiments (e.g., FIG. 17), the electronic device 200 may include the connection member 293 coupled to the support member 300. According to an embodiment, the connection member 293 may be a C-clip. According to an embodiment, the connection member 293 may be positioned between the rear plate 280 and the support member 300. According to an embodiment, the first surface 300a may be the rear surface of the support member 300 facing the rear plate 280.

Figure 18:
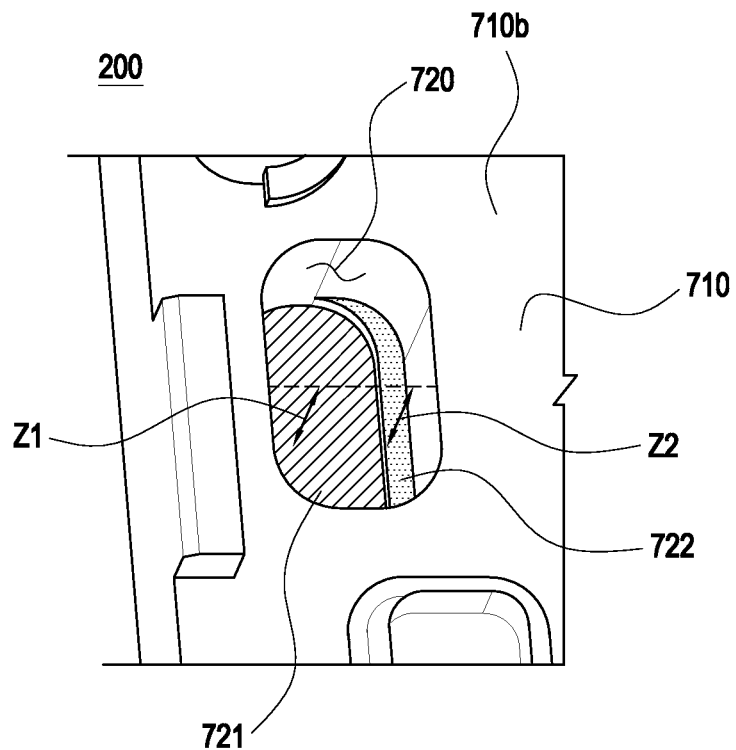
FIG. 18 is a perspective view illustrating the structure of an electronic device including an indicating space and a support member, before a cutting process is performed according to various embodiments of the disclosure.
Figure 19:
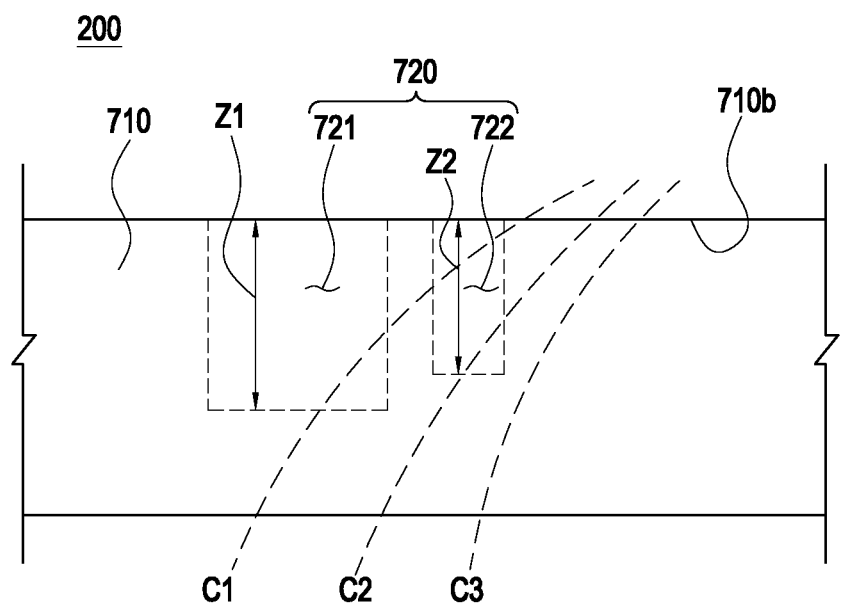
FIG. 19 is a cross-sectional view illustrating the structure of an electronic device including an indicating space and a support member, before a cutting process is performed according to various embodiments of the disclosure.
Figure 20A:
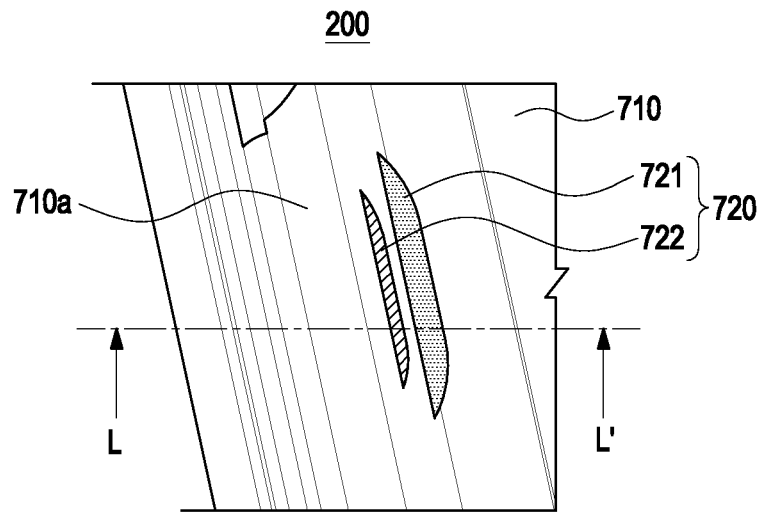
FIG. 20A is a diagram illustrating a structure into which the electronic device of FIG. 18 is processed according to various embodiments of the disclosure.
Figure 20B:
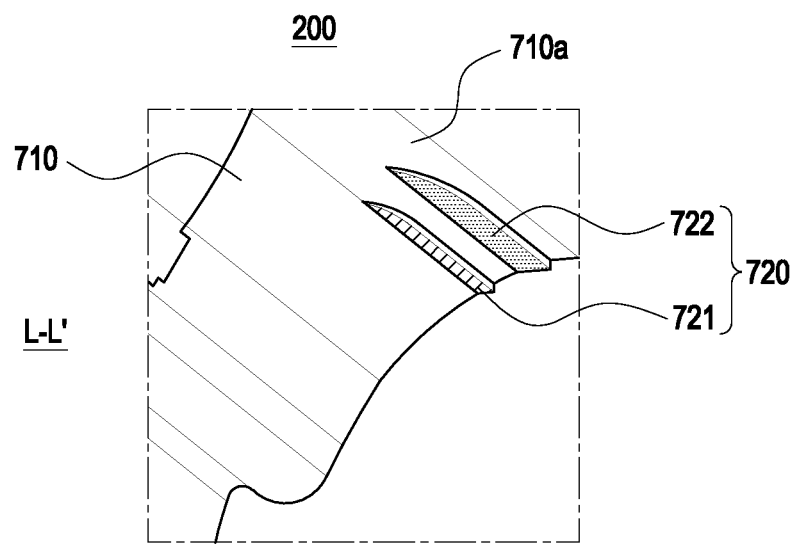
FIG. 20B is a cross-sectional view taken along line L-L' of FIG. 20A.
Figure 21A:
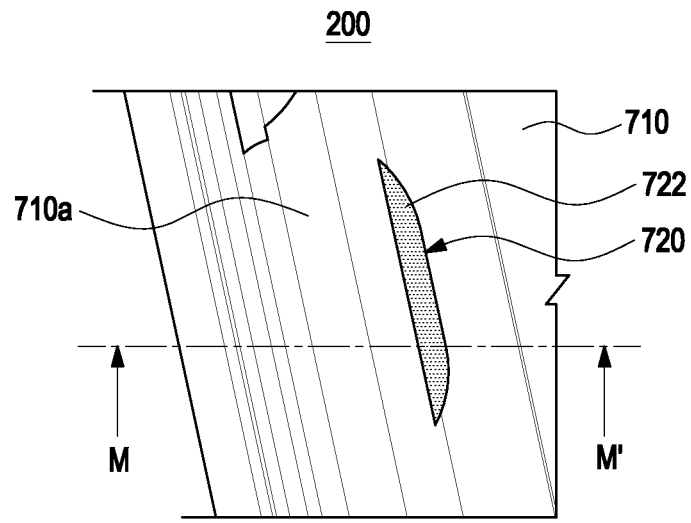
FIG. 21A is a diagram illustrating a structure into which the electronic device of FIG. 18 is processed according to various embodiments of the disclosure.
Figure 21B:
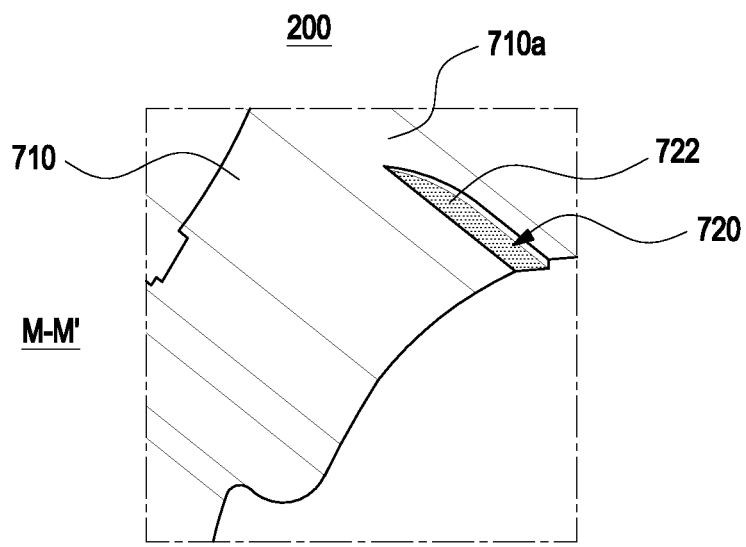
FIG. 21B is a cross-sectional view taken along line M-M' of FIG. 21A.
Figure 22A:
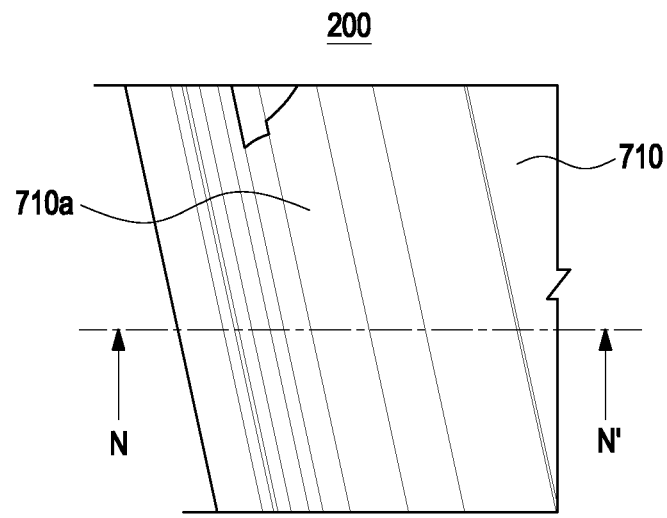
FIG. 22A is a diagram illustrating a structure into which the electronic device of FIG. 18 is processed according to various embodiments of the disclosure.
Figure 22B:
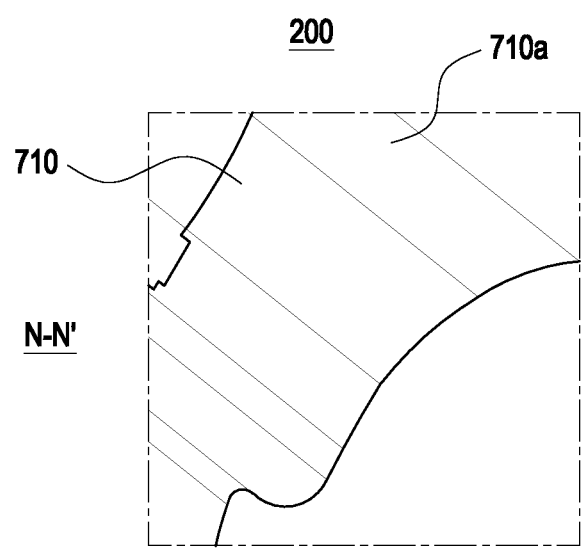
FIG. 22B is a cross-sectional view taken along line N-N' of FIG. 22A.

FIG. 18 is a perspective view illustrating the structure of an electronic device including an indicating space and a support member, before a cutting process is performed according to various embodiments of the disclosure. FIG. 19 is a cross-sectional view illustrating the structure of an electronic device including an indicating space and a support member, before a cutting process is performed according to various embodiments of the disclosure. FIG. 20A is a diagram illustrating a structure into which the electronic device of FIG. 18 is processed according to various embodiments of the disclosure, and FIG. 20B is a cross-sectional view taken along line L-L' of FIG. 20A. FIG. 21A is a diagram illustrating a structure into which the electronic device of FIG. 18 is processed according to various embodiments of the disclosure, and FIG. 21B is a cross-sectional view taken along line M-M' of FIG. 21A. FIG. 22A is a diagram illustrating a structure into which the electronic device of FIG. 18 is processed according to various embodiments of the disclosure, and FIG. 22B is a cross-sectional view taken along line N-N' of FIG. 22A.

Referring to FIGS. 18 to 22B, the electronic device 200 may include an indicating space 720 and a support member 710. The configurations of the indicating space 720 and the supporting member 710 of FIGS. 18 to 22B may be wholly or partially identical to those of the indicating space 520 and the supporting member 510 of FIGS. 12A and 12B.

According to various embodiments, the indicating space 720 may be used as an indication mark for determining the processed degree of the support member 710. For example, the configuration of the indicating space 720 may be wholly or partially identical to that of an indicator (e.g., the indicator 400 of FIG. 9D).

According to an embodiment, a degree to which the indicating space 720 is exposed to the outside of the support member 710 may be changed based on the cut-processed degree of the support member 710 and the indicating space 720. For example, a part of the support member 710, which forms the indicating space 720, may be cut in a cutting process of the electronic device 200, and the shape of the indicating space 720 may be changed based on the cut-processed degree of the support member 710. For example, an outer surface 710b of the support member 710 may be removed by using the cutting process.

According to an embodiment, the indicating space 720 may include a first indicating area 721 and a second indicating area 722 having different depths. For example, a fourth depth Z2 of the second indicating area 722 may be greater than a third depth Z1 of the first indicating area 721. According to an embodiment, the indicating space 720 may be interpreted as a groove formed in the surface 710b of the support member 710 before processing the support member 710. According to an embodiment, the first indicating area 721 may be spaced apart from the second indicating area 722.

According to various embodiments, the manufacturer of the electronic device 200 may determine whether the support member 710 is defective based on the shape or number of indicating spaces 720 exposed to the outside of the support member 710 in the manufacturing process of the electronic device 200.

According to an embodiment (e.g., FIGS. 20A and 20B), the indicating space 720 may be visually exposed at a plurality of (e.g., two) points to the outside of the support member 710. For example, at least a part of the first indicating area 721 and at least a part of the second indicating area 722 may be visually exposed to the outside of the support member 710. According to an embodiment, at least a part of the first indicating area 721 and at least a part of the second indicating area 722 may be located on substantially the same surface as a cut surface 710a of the support member 710. According to an embodiment, the support member 710 of FIGS. 20A and 20B may be interpreted as in the insufficient cutting state. According to an embodiment, a first cutting line C1 of FIG. 19 may be substantially the same as line L-L' of FIGS. 20A and/or 20B. The first cutting line C1 may pass through the first indicating area 721 and the second indicating area 722.

According to an embodiment (e.g., FIGS. 21A and 21B), the indicating space 720 may be visually exposed at one point to the outside of the support member 710. For example, at least a part of the second indicating area 722 may be visually exposed to the outside of the support member 710, and the first indicating area 721 may be removed by using the cutting process of the support member 710. According to an embodiment, at least a part of the second indicating area 722 may be located on substantially the same surface as the cut surface 710a of the support member 710. According to an embodiment, the support member 710 of FIGS. 21A and 21B may be interpreted as in the optimal cutting state. According to an embodiment, a second cutting line C2 of FIG. 19 may be substantially the same as line M-M' of FIG. 21A and/or FIG. 21B. The second cutting line C2 may pass through the second indicating area 722 without passing through the first indicating area 721.

According to an embodiment (e.g., FIGS. 22A and 22B), the indicating space 720 may not be visually exposed to the outside of the support member 710. For example, the first indicating area 721 and the second indicating area 722 may be removed by using the cutting process of the support member 710. According to an embodiment, the support member 710 of FIGS. 22A and 22B may be interpreted as in the over-cutting state. According to an embodiment, a third cutting line C3 of 9 may be substantially the same as line N-N' of FIG. 22A and/or FIG. 22B. The third cutting line C3 may not pass through the first indicating area 721 and the second indicating area 722.

Figure 23:
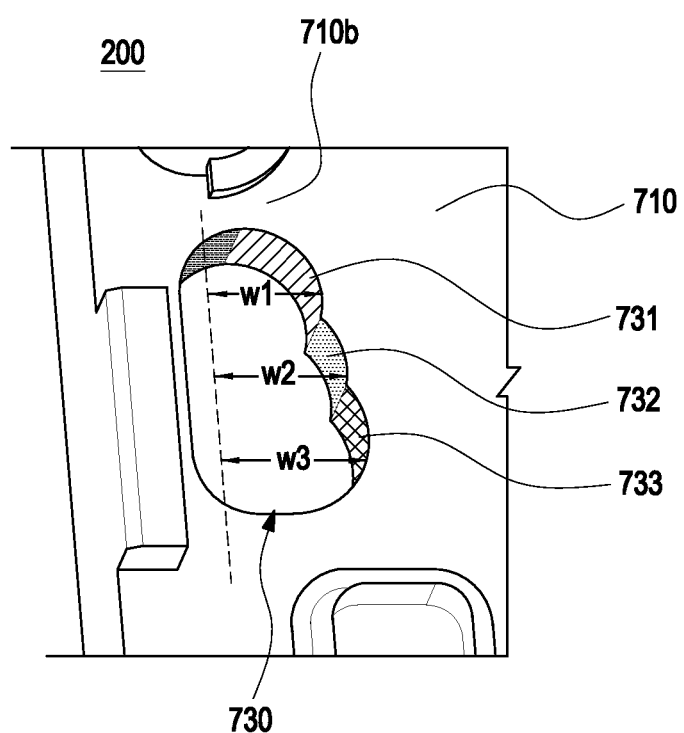
FIG. 23 is a diagram illustrating an indicating space and the structure of a support member, before a cutting process is performed according to various embodiments of the disclosure.
Figure 24A:
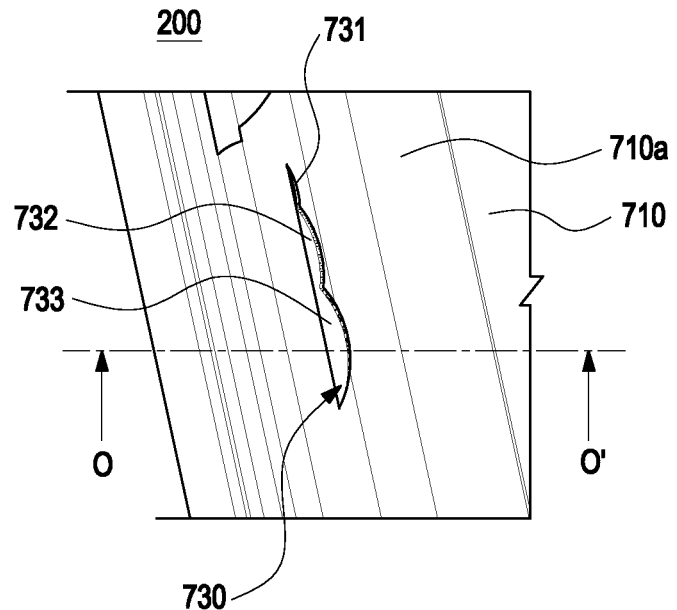
FIG. 24A is a diagram illustrating a structure into which the electronic device of FIG. 23 is processed according to various embodiments of the disclosure.
Figure 24B:
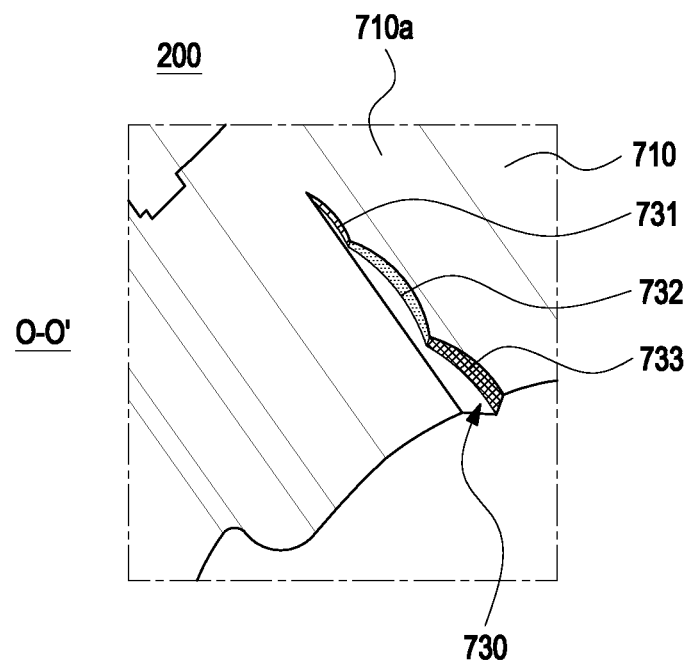
FIG. 24B is a cross-sectional view taken along line O-O' of FIG. 24A.
Figure 25A:
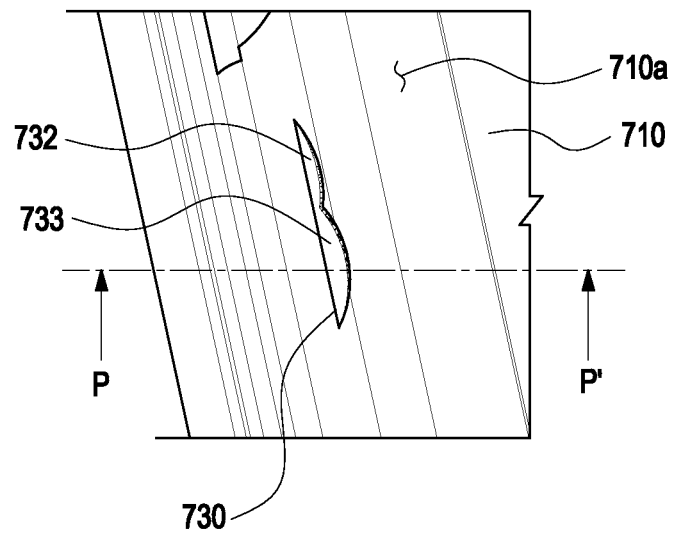
FIG. 25A is a diagram illustrating a structure into which the electronic device of FIG. 23 is processed according to various embodiments of the disclosure.
Figure 25B:
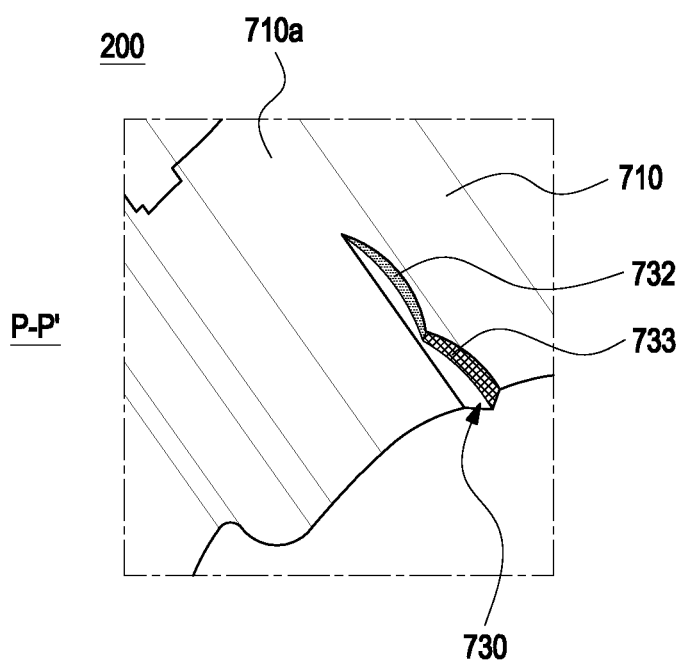
FIG. 25B is a cross-sectional view taken along line P-P' of FIG. 25A.
Figure 26A:
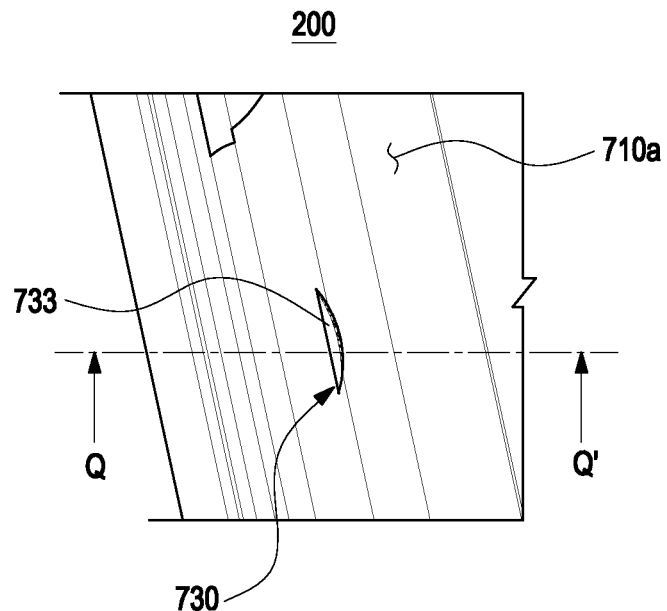
FIG. 26A is a diagram illustrating a structure into which the electronic device of FIG. 23 is processed according to various embodiments of the disclosure.
Figure 26B:
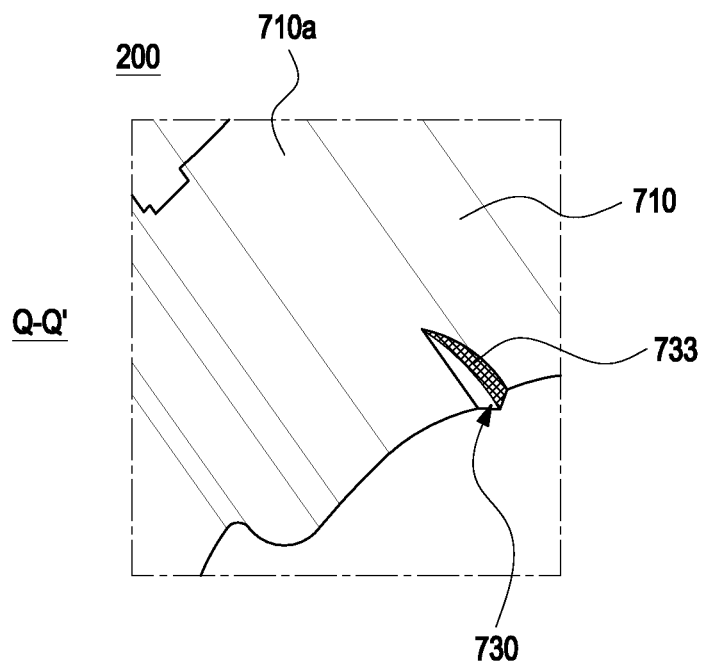
FIG. 26B is a cross-sectional view taken along line Q-Q' of FIG. 26A.

FIG. 23 is a diagram illustrating an indicating space and the structure of a support member, before a cutting process is performed according to various embodiments of the disclosure. FIG. 24A is a diagram illustrating a structure into which the electronic device of FIG. 23 is processed according to various embodiments of the disclosure, and FIG. 24B is a cross-sectional view taken along line O-O' of FIG. 24A. FIG. 25A is a diagram illustrating a structure into which the electronic device of FIG. 23 is processed according to various embodiments of the disclosure, and FIG. 25B is a cross-sectional view taken along line P-P' of FIG. 25A. FIG. 26A is a diagram illustrating a structure into which the electronic device of FIG. 23 is processed according to various embodiments of the disclosure, and FIG. 26B is a cross-sectional view taken along line Q-Q' of FIG. 26A.

Referring to FIGS. 23 to 26B, the electronic device 200 may include an indicating space 730 and the support member 710. The configurations of the indicating space 730 and the support member 710 of FIGS. 23 to 26B may be wholly or partially identical to those of the indicating space 720 and the support member 710 of FIGS. 19 to 22B.

According to various embodiments, the indicating space 730 may be used as an indication marker for determining the processed degree of the support member 710. For example, the configuration of the indicating space 730 may be wholly or partially identical to that of an indicator (e.g., the indicator 400 of FIG. 9D).

According to an embodiment, a degree to which the indicating space 730 is exposed to the outside of the support member 710 may be changed based on the cut-processed degree of the support member 710 and the indicating space 730. For example, a part of the support member 710, which forms the indicating space 730, may be cut during cutting of the electronic device 200, and the shape of the indicating space 730 may be changed based on the cut-processed degree of the support member 710. For example, the outer surface 710b of the support member 710 may be removed by using the cutting process.

According to an embodiment, the indicating space 730 may include a third indicating area 731, a fourth indicating area 732, and a fifth indicating area 733. The third indicating area 731, the fourth indicating area 732, and the fifth indicating area 733 may have different widths, such as a first width w1 of the third indicating area 731, a second width w2 of the fourth indicating area 732, and a third width w3 of the fifth indicating area 733. For example, a third width w3 of the fifth indicating area 733 may be greater than a second width w2 of the fourth indicating area 732, and the second width w2 of the fourth indicating area 732 may be greater than the first width w1 of the third indicating area 731. For example, the fifth indicating area 733 may be closer to the center of the electronic device 200 than the fourth indicating area 732, and the fourth indicating area 732 may be closer to the center of the electronic device 200 than the third indicating area 731. According to an embodiment, the indicating space 730 may be interpreted as a groove formed in the surface 710b of the support member 710 before the processing.

According to various embodiments, the manufacturer of the electronic device 200 may determine whether the support member 710 is defective based on the shape or number of indicating spaces 730 exposed to the outside of the support member 710 in the manufacturing process of the electronic device 200.

According to an embodiment (e.g., FIGS. 24A and 24B), the indicating space 730 may be visually exposed in three areas to the outside of the support member 710. For example, at least a part of the third indicating area 731, at least a part of the fourth indicating area 732, and at least a part of the fifth indicating area 733 may be visually exposed to outside the support member 710. According to an embodiment, at least a part of the third indicating area 731, the fourth indicating area 732, and at least a part of the fifth indicating area 733 may be a groove formed into the cut surface 710a of the support member 710. According to an embodiment, the support member 710 of FIGS. 24A and 24B may be interpreted as in the insufficient cutting state.

According to an embodiment (e.g., FIGS. 25A and 25B), the indicating space 730 may be visually exposed at two points to the outside of the support member 710. For example, at least a part of the fourth indicating area 732 and at least a part of the fifth indicating area 733 may be visually exposed to the outside of the support member 710, and the third indicating area 731 may be excluded from the cutting process of the support member 710. According to an embodiment, the fourth indicating area 732 and at least a part of the fifth indicating area 733 may be a groove formed in the cut surface 710a of the support member 710. According to an embodiment, the support member 710 of FIGS. 25A and 25B may be interpreted as in the optimal cutting state.

According to an embodiment (e.g., FIGS. 26A and 26B), one area (e.g., the fifth indicating area 733) of the indicating space 730 may be visually exposed to the outside. For example, at least a part of the fifth indicating area 733 may be visually exposed to the outside of the support member 710, and the third indicating area 731 and the fourth indicating area 732 may be excluded from the cutting process of the support member 710. According to an embodiment, at least a part of the fifth indicating area 733 may be a groove formed in the cut surface 710a of the support member 710. According to an embodiment, the support member 710 of FIGS. 26A and 26B may be interpreted as in the over-cutting state.

Although a structure in which the indicating space 730 has three areas having different widths is disclosed in FIGS. 23 to 26B, which should not be construed as limiting the disclosure. For example, the indicating space 730 may include two areas or four or more areas having different widths.

According to various embodiments of the disclosure, an electronic device (e.g., the electronic device 200 of FIG. 1) may include a support member (e.g., the support member 300 of FIG. 4) formed of a first material and including a first surface (e.g., the first surface 300a of FIG. 4), a second surface (e.g., the second surface 300b of FIG. 4) opposite to the first surface, and an accommodation space (e.g., the accommodation space 310 of FIG. 5B) formed between the first surface and the second surface, and an indicator (e.g., the indicator 400 of FIG. 4) formed of a second material different from the first material, at least partially disposed inside the accommodation space, and including a third surface (e.g., the third surface 400a of FIG. 6B) visually exposed to the outside of the support member and forming substantially the same surface with at least a part of the first surface of the support member.

According to various embodiments, the indicator may include a first area (e.g., the first area 410 of FIG. 9B) at least partially exposed to the outside of the support member, and a second area (e.g., the second area 420 of FIG. 9B) extending from the first area and including a fourth surface (e.g., the fourth surface 400b of FIG. 9B) covered by the support member. According to various embodiments, the second area may be formed having a shape (e.g., a step or a Lego™ block) reflected from a shape of the first area.

According to various embodiments, the first area may be formed having a first length (e.g., the first length X1 of FIG. 9B), and the second area may be formed having a second length (e.g., the second length X2 of FIG. 9B) different from the first length.

According to various embodiments, the indicator may include a third area (e.g., the third area 430 of FIG. 9B) extending from the first area to the second area and formed having a third length (e.g., the third length X3 of FIG. 6B) less than the first length or the second length.

According to various embodiments, the first material may include at least one of aluminum, stainless steel, titanium, and magnesium, and the second material may include a resin.

According to various embodiments, the support member may include at least one recess (e.g., the recess 320 of FIG. 4) spaced apart from the first surface.

According to various embodiments, the accommodation space may include a first groove (e.g., the first groove 311 of FIG. 5B) formed to a first depth (e.g., the first depth d1 of FIG. 5B), and a second groove (e.g., the second groove 313 of FIG. 5B) extending from the first groove and formed to a second depth (e.g., the second depth d2 of FIG. 5B) greater than the first depth.

According to various embodiments, the electronic device may further include a display (e.g., the display 220 of FIG. 14B) disposed on the support member, and at least a part of the display may face the first surface and the third surface.

According to various embodiments, the electronic device may further include a rear plate (e.g., the rear plate 280 of FIG. 15B) disposed on the support member, and the rear plate may face the first surface and the third surface.

According to various embodiments, the electronic device may further include a connection member (e.g., the connection member 293 of FIG. 17) located between the rear plate and the support member and contacting at least one of the first surface or the third surface.

According to various embodiments, the electronic device may further include at least one electronic component (e.g., the camera module 212 of FIG. 3) disposed on the support member, the first surface may surround at least a part of the electronic component, and the electronic component may face the third surface.

According to various embodiments, the indicator may include a plurality of protrusions (e.g., the first area 410 and the second area 420 of FIG. 9B) at least a part of which has a polygonal shape and/or a curved surface.

According to various embodiments, the indicator may include a fifth surface (e.g., the fifth surface 400c of FIG. 9D) forming substantially a same surface with at least a part of the second surface.

According to various embodiments, the indicator may be formed in the accommodation space by insert-injection.

According to various embodiments, the electronic device may further include a battery (e.g., the battery 250 of FIG. 3) on the support member.

According to various embodiments of the disclosure, an electronic device (e.g., the electronic device 200 of FIG. 1) may include a support member (e.g., the support member 300 of FIG. 4) formed of a first material and including an accommodation space (e.g., the accommodation space 310 of FIG. 5B), and an indicator (e.g., the indicator 400 of FIG. 4) formed of a second material different from the first material and at least partially disposed inside the accommodation space. The indicator may include a first area (e.g., the first area 410 of FIG. 9B) at least partially visually exposed to an outside of the support member, and a second area (e.g., the second area 420 of FIG. 9B) extending from the first area and covered by the support member.

According to various embodiments, the second area may be formed having a shape (e.g., a step or a Lego' block) reflected from a shape of the first area.

According to various embodiments, the first area may be formed having a first length (e.g., the first length X1 of FIG. 9B), and the second area may be formed having a second length (e.g., the second length X2 of FIG. 9B) different from the first length.

According to various embodiments, the indicator may include a third area (e.g., the third area 430 of FIG. 9B) extending from the first area to the second area and formed having a third length (e.g., the third length X3 of FIG. 6B) less than the first length or the second length.

According to various embodiments, the first material may include at least one of aluminum, stainless steel, titanium, and magnesium, and the second material may include a resin.

The above-described electronic device including a support member of the disclosure is not limited to the above-described embodiments and drawings, and it will be apparent to those skilled in the art that various substitutions, modifications, and changes can be made within the technical scope of the disclosure.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
a support member formed of a first material and including:
a first surface,
a second surface opposite to the first surface, and
an accommodation space formed between the first surface and the second surface; and
an indicator formed of a second material different from the first material by insert-injection, at least partially disposed inside the accommodation space, and including a third surface visually exposed to an outside of the support member,
wherein the third surface is formed by cutting the indicator together with the support member, and an entire portion of the third surface which is exposed to the outside of the support member forms substantially a same surface with at least a part of the first surface of the support member.

2. The electronic device of claim 1, wherein the indicator includes:
a first area at least partially exposed to the outside of the support member, and
a second area extending from the first area and including a fourth surface covered by the support member.

3. The electronic device of claim 2, wherein the second area is formed having a shape reflected from a shape for the first area.

4. The electronic device of claim 2, wherein:
the first area is formed having a first length, and
the second area is formed having a second length different from the first length.

5. The electronic device of claim 4, wherein the indicator includes a third area extending from the first area to the second area and formed having a third length less than the first length or the second length.

6. The electronic device of claim 1, wherein:
the first material includes at least one of aluminum, stainless steel, titanium, and magnesium, and
the second material includes a resin.

7. The electronic device of claim 1, wherein the support member includes at least one recess spaced apart from the first surface.

8. The electronic device of claim 1, wherein the accommodation space includes:
a first groove formed to a first depth, and
a second groove extending from the first groove and formed to a second depth greater than the first depth.

9. The electronic device of claim 1, further comprising a display disposed on the support member,
wherein at least a part of the display faces the first surface and the third surface.

10. The electronic device of claim 1, further comprising a rear plate disposed on the support member,
wherein the rear plate faces the first surface and the third surface.

11. The electronic device of claim 10, further comprising a connection member located between the rear plate and the support member, and contacting at least one of the first surface or the third surface.

12. The electronic device of claim 1, further comprising at least one electronic component disposed on the support member,
wherein the first surface surrounds at least a part of the electronic component, and the electronic component faces the third surface.

13. The electronic device of claim 1, wherein the indicator includes a plurality of protrusions at least a part of which has a polygonal shape or a curved surface.

14. The electronic device of claim 1, wherein the indicator includes a fifth surface forming substantially a same surface with at least a part of the second surface.

15. An electronic device comprising:
a support member formed of a first material and including an accommodation space, a first surface and a second surface; and
an indicator formed of a second material different from the first material and at least partially disposed inside the accommodation space,
wherein the indicator includes:
a first area at least partially visually exposed to an outside of the support member,
a second area extending from the first area and covered by the support member, and
a third surface formed by cutting the indicator together with the support member,
wherein an entire portion of the third surface which is exposed to the outside of the support member forms substantially a same surface with at least a part of the first surface of the support member.

16. The electronic device of claim 15, wherein the second area is formed having a shape reflected from a shape of the first area.

17. The electronic device of claim 15, wherein:
the first area is formed having a first length, and the second area is formed having a second length different from the first length.

18. The electronic device of claim 17, wherein the indicator includes a third area extending from the first area to the second area and formed having a third length less than the first length or the second length.

19. The electronic device of claim 15, wherein:
the first material includes at least one of aluminum, stainless steel, titanium, and magnesium, and
the second material includes a resin.

* * * * *